US010886400B2

United States Patent
Shinohara

(10) Patent No.: US 10,886,400 B2
(45) Date of Patent: Jan. 5, 2021

(54) SEMICONDUCTOR DEVICE HAVING A DRAIN DRIFT-REGION IN CONTACT WITH THE BODY REGION

(71) Applicant: ABLIC Inc., Chiba (JP)

(72) Inventor: Hirofumi Shinohara, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/432,615

(22) Filed: Jun. 5, 2019

(65) Prior Publication Data

US 2019/0378925 A1      Dec. 12, 2019

(30) Foreign Application Priority Data

Jun. 6, 2018   (JP) ................................. 2018-108684

(51) Int. Cl.
  *H01L 29/66* (2006.01)
  *H01L 29/78* (2006.01)
  *H01L 29/06* (2006.01)

(52) U.S. Cl.
  CPC ...... *H01L 29/7816* (2013.01); *H01L 29/0649* (2013.01); *H01L 29/66681* (2013.01)

(58) Field of Classification Search
  CPC ......... H01L 29/66674; H01L 29/66681; H01L 29/7801; H01L 29/7816; H01L 29/7824
  See application file for complete search history.

(56) References Cited

U.S. PATENT DOCUMENTS

| | | |
|---|---|---|
| 5,844,275 A | 12/1998 | Kitamura et al. |
| 2015/0097236 A1* | 4/2015 | Tsai ................... H01L 29/7816 257/339 |

FOREIGN PATENT DOCUMENTS

JP       H 08-097411 A      4/1996

* cited by examiner

*Primary Examiner* — Hoai V Pham
(74) *Attorney, Agent, or Firm* — Brinks Gilson & Lione

(57) ABSTRACT

A semiconductor device (1) includes a drain region (14) of a first conductivity type which includes a high-concentration drain region (14a), a first drain drift-region (14b), and a second drain drift-region (14c) of the first conductivity type, a source region (15) of the first conductivity type, a body region (16) of a second conductivity type, a gate insulating film (12), a gate electrode (13), and an STI insulating film (11) formed on the drain region (14). The second drain drift-region (14c) is formed from a first position (11f) of the STI insulating film (11) which is away from a first corner portion (11a) by a distance (x1) in a direction of a second corner portion (11b).

7 Claims, 18 Drawing Sheets

SEMICONDUCTOR DEVICE HAVING A DRAIN DRIFT-REGION IN CONTACT WITH THE BODY REGION

RELATED APPLICATIONS

Priority is claimed on Japanese Patent Application No. 2018-108684, filed on Jun. 6, 2018, the content of which is incorporated herein by reference.

BACKGROUND OF THE INVENTION

1. Field of the Invention

The present invention relates to a semiconductor device and a method of manufacturing the same.

2. Description of the Related Art

In recent years, with increased functionality of medical diagnostic apparatus and ultrasonic diagnostic apparatus used for nondestructive inspection of architectural buildings or the like, or of sonar and devices for underwater communication, there are increased demands for an integrated circuit (IC) that operates at a high-power supply voltage and are capable of supplying a large current to the load. For an output element in such ICs, a semiconductor device with a high breakdown voltage and a low on-resistance is hence required.

A laterally diffused metal oxide semiconductor field effect transistor (LDMOSFET) is known as a semiconductor device with high breakdown voltage and low on-resistance that can be integrated on a semiconductor substrate and used for supply of switching signals and amplification of signal amplitudes.

In general, an LDMOSFET having a higher drain breakdown voltage is achieved by extending a length of a drain drift-region and forming a thick insulating film on the drain drift-region, for example, to thereby achieve reduction of the drain electric field. The thick insulating film often serves also as an element isolation film used in a CMOS logic circuit that is integrated at the same time. In a semiconductor manufacturing process for producing a semiconductor device, for example, a design rule that is approximately larger than 0.25 um is adopted, then a local oxidation of silicon (LOCOS) insulating film used for element isolation is applied as the thick insulating film.

In Japanese Patent Application Laid-open No. H 8-97411 (see FIG. 1), there is disclosed a technology in which a shallow trench isolation (STI) insulating film is formed as a thick insulating film in a drain drift-region of an LDMOSFET to achieve an LDMOSFET having a higher drain breakdown voltage while increasing a length of the drain drift-region in a longitudinal direction thereof, and at the same time, reducing a required planar area and an on-resistance per unit area.

However, in the LDMOSFET of Japanese Patent Application Laid-open No. H 8-97411, generation of hot carriers near a corner portion of an STI insulating film becomes noticeable, and it is difficult to suppress changes along time in threshold voltage and drain current caused by the hot carriers (hereinafter referred to as "hot-carrier degradation"). There is accordingly room for improvement in long-term reliability for stabilizing characteristics of the LDMOSFET for a long time.

The hot carriers accelerated in high electric fields to have high energy generate secondary carriers which cause the hot-carrier degradation by their energy at a collision against the lattice that generally exists in the electric current path. The amount of the generated secondary carriers correlates with the magnitudes of the drain electric field and the drain current density. In the configuration illustrated in FIG. 1 of Japanese Patent Application Laid-open No. 8-97411 in which the drain drift-region includes the STI insulating film the angle of the corner portion of the STI insulating film at which the bottom surface and the side surface of the element isolation insulating film intersect is acuter than the angle of the corner portion of the LOCOS, and hence the drain current tends to concentrate in the semiconductor substrate near the corner portion of the STI insulating film. It is considered that, near the corner portion of the STI insulating film, the drain current density increases, and the generation of the hot carriers is noticeable.

Meanwhile, relaxation of the drain electric field by reducing the impurity concentration of the drain drift-region in order to suppress the generation of the hot carriers increases the drain resistance of the drain drift-region, and it becomes difficult to reduce the on-resistance.

SUMMARY OF THE INVENTION

The present invention has been made to provide a semiconductor device and a method of manufacturing the same with which hot-carrier degradation can be suppressed, and with which a high drain breakdown voltage and a reduction in on-resistance, as well as increased long-term reliability, are achieved.

In order to solve the above-mentioned problem, the present invention uses the following measures.

That is, according to one embodiment of the present invention, there is provided a semiconductor device which is formed on a semiconductor substrate, the semiconductor device including: a drain region of a first conductivity type; a source region of the first conductivity type; a body region of a second conductivity type formed between the drain region and the source region; a gate insulating film formed on the body region; a gate electrode formed on the gate insulating film; a trench formed in the drain region; and a thick insulating film which is formed in the trench and has a thickness that is larger than a thickness of the gate insulating film, the trench having a first trench side surface opposed to the body region, a second trench side surface which is opposed to the first trench side surface and the body region and is formed farther away from the body region than the first trench side surface, a trench bottom surface, and a first corner portion formed at an intersecting portion between the trench bottom surface and the first trench side surface as seen in cross section and a second corner portion formed at an intersecting portion between the trench bottom surface and the second trench side surface as seen in cross section, the drain region including a first drain drift-region formed in contact with the body region, the first trench side surface, and the trench bottom surface from the first corner portion to a first position; a second drain drift-region which is formed in contact with the trench bottom surface to extend from the first position in a direction of the second corner portion, and has an impurity concentration that is higher than an impurity concentration of the first drain drift-region; and a high-concentration drain region which is formed away from the body region, the first trench side surface, and the trench bottom surface, and has an impurity concentration that is higher than the impurity concentration of the second drain drift-region.

Further, according to one embodiment of the present invention, there is provided a method of manufacturing a semiconductor device which is formed on a semiconductor substrate and includes, in a drain region containing impurities of a first conductivity type, a thick insulating film having a thickness that is larger than a thickness of a gate insulating film, the method of manufacturing a semiconductor device including: forming a first drain drift-region in the drain region by implanting impurities of the first conductivity type from a surface of the semiconductor substrate; forming an opening portion of a first insulating film by depositing the insulating film on the semiconductor substrate, and etching the first insulating film; forming a trench by etching the semiconductor substrate through use of the opening portion of the first insulating film as a mask, the trench having a first trench side surface, a second trench side surface, a trench bottom surface, a first corner portion formed at an intersecting portion between the first trench side surface and the trench bottom surface, and a second corner portion formed at an intersecting portion between the second trench side surface and the trench bottom surface; forming the thick insulating film in the trench by depositing a second insulating film on the semiconductor substrate and in the trench to a thickness at which an upper surface of the trench becomes flat, and then removing the second insulating film in regions other than the trench; forming the gate insulating film on the semiconductor substrate; forming a gate electrode on the gate insulating film; and forming a second drain drift-region of the first conductivity type in the first drain drift-region from a first position which is in contact with the trench bottom surface and is away from the first corner portion, in a direction toward the second corner portion along the trench bottom surface, the second drain drift-region having an impurity concentration that is higher than an impurity concentration of the first drain drift-region.

According to the present invention, with the low impurity concentration near the corner portion of the STI insulating film of the drain drift-region, a drain electric field can be reduced, and the hot-carrier degradation can be suppressed. Moreover, in the drain drift-region, through the increase in impurity concentration in the region that is away from the corner portion of the STI insulating film by a predetermined distance on the high-concentration drain region side, the on-resistance can be reduced. Accordingly, there can be achieved the semiconductor device having the high drain breakdown voltage and the reduced on-resistance as well as the increased long-term reliability.

DETAILED DESCRIPTION OF THE PREFERRED EMBODIMENTS

Before description of embodiments of the present invention, in order to facilitate understanding of the embodiments, a description is given of a problem of hot-carrier degradation found by the inventor of the present invention in a semiconductor device including an STI insulating film in a drain drift-region.

Figure 13:
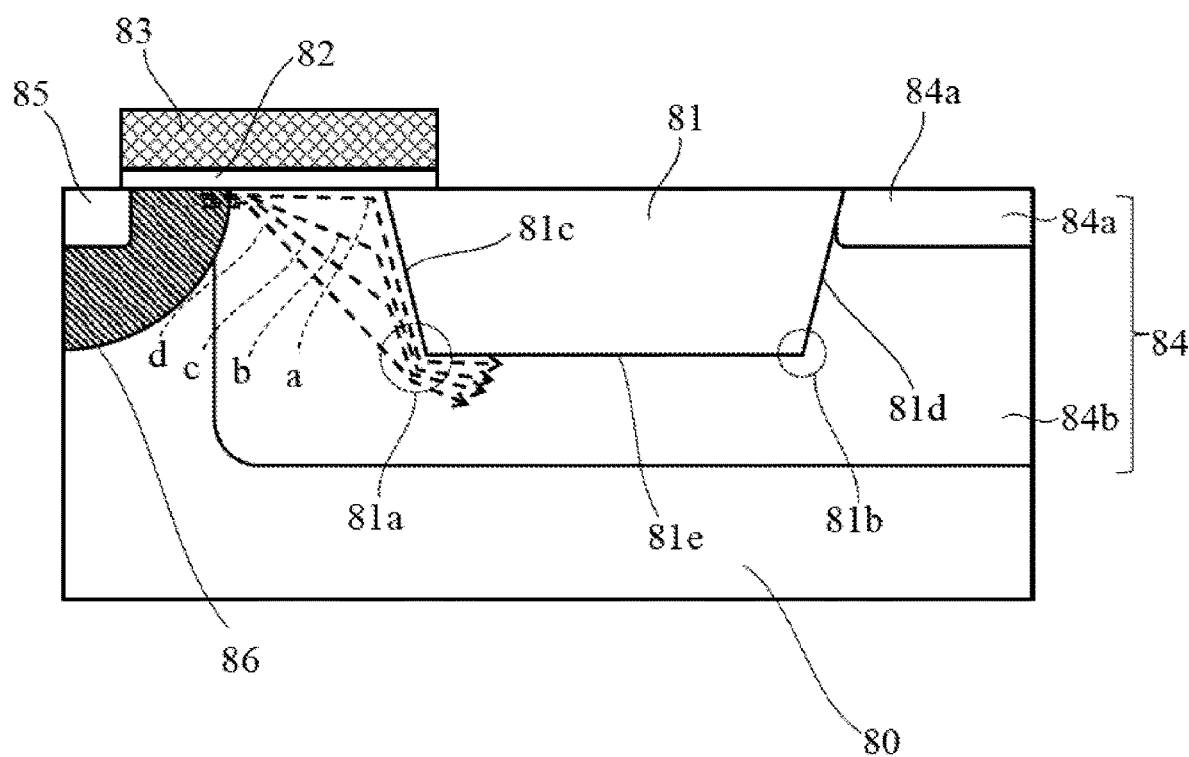
FIG. 13 is a cross-sectional view of a semiconductor device in related art.

FIG. 13 shows a conventional semiconductor device 8 in related art by a cross-sectional view of an n-channel LDMOSFET. The semiconductor device 8 includes an n-type drain region 84 and an n-type source region 85 which are formed on a p-type semiconductor substrate 80, a p-type body region 86, a gate insulating film 82, a gate electrode 83, and an STI insulating film 81. The drain region 84 includes a high-concentration drain region 84a and a first drain drift-region 84b, and the STI insulating film 81 is formed on the first drain drift-region 84b.

The first drain drift-region 84b covers a first trench side surface 81c, a second trench side surface 81d, a trench bottom surface 81e, a first corner portion 81a, and a second corner portion 81b, and is in contact with a portion of the body region 86. During an ON operation of the semiconductor device 8, electrons that flow from the source region 85 toward the high-concentration drain region 84a along a channel formed on a surface of the body region 86 travel while spreading in a depth direction in the first drain drift-region 84b as indicated by paths a, b, c, and d illustrated by the dotted-line arrows.

For example, a part of electrons that flow into the first drain drift-region 84b travel laterally in a straight line along a path "a" indicated by the dotted-line arrow, and after arriving at the first trench side surface 81c, meanders along the first trench side surface 81c and the trench bottom surface 81e. The degree of meandering reduces as the direction in which the electrons flow from the channel into the first drain drift-region 84b is farther away from the surface of the semiconductor substrate 80 as indicated by the paths b, c, and d illustrated by the dotted-line arrows. However, since all electrons that travel through the paths a, b, c, and d pass near the first corner portion 81a, the density of the drain current which flows near the first corner portion 81a increases. After passing near the first corner portion 81a, those electrons travel toward the high-concentration drain region 84a while spreading in the depth direction in the first drain drift-region 84b, and hence the drain current density reduces.

Now, when a high voltage is applied to the drain, and a depletion layer expands from a boundary with the channel into the first drain drift-region 84b, hot carriers having high energy tend to generate near the first corner portion 81a due to a drain electric field in the depletion layer and the increased drain current density. The hot carriers generate secondary carriers by their energy at collision against the lattice that exists in the electric current path. Capture of the secondary carriers by the gate insulating film changes the potential distribution of the semiconductor substrate near the channel, and the change in the potential distribution causes degradations in characteristics, such as the threshold voltage and the channel mobility. Moreover, capture of the secondary carriers by the insulating film on the first drain drift-region 84b changes the potential distribution of the semiconductor substrate near the insulating film, and the change in the potential distribution causes degradations in characteristics, such as a variation in the drain current.

Such degradations in characteristics caused by the hot carriers impair long-term reliability of the semiconductor device. The present invention has been made based on such findings to suppress the hot-carrier degradation.

Now, the embodiments of the present invention are described in detail with reference to the drawings as appropriate. In the following, an n-channel LDMOSFET is described as an example of the semiconductor device. The drawings used in the following description may be partly omitted or enlarged and may not be drawn to scale in order to facilitate understanding of features of the present invention.

First Embodiment

Now, a semiconductor device and a method of manufacturing the same according to the first embodiment of the present invention are described.

Figure 1:
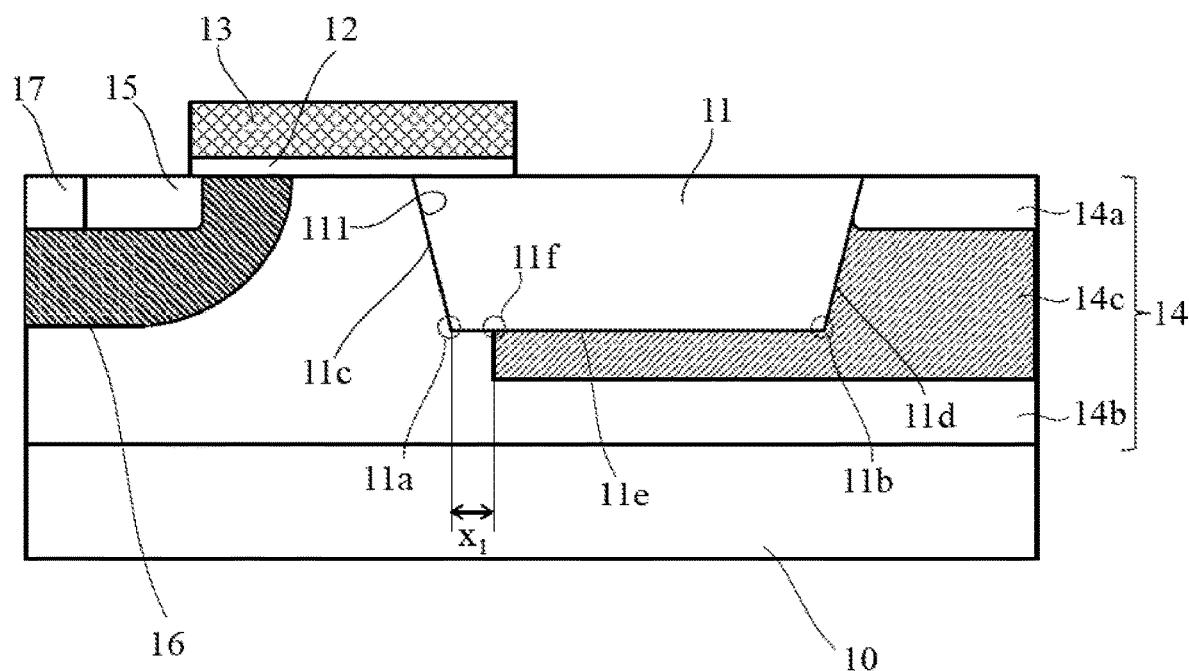
FIG. 1 is a cross-sectional view of a semiconductor device according to a first embodiment of the present invention.

FIG. 1 is a cross-sectional view of a semiconductor device 1 according to the first embodiment of the present invention.

The semiconductor device 1 according to the first embodiment is formed on a semiconductor substrate 10 made of p-type silicon, for example, and includes an n-type drain region 14 and an n-type source region 15, a p-type body region 16 formed between the drain region 14 and the source region 15, a p-type body contact region 17 formed on the body region 16, a gate insulating film 12, and a gate electrode 13. The drain region 14 includes a high-concentration drain region 14a, a first drain drift-region 14b, and a second drain drift-region 14c. Moreover, a trench 111 is formed in the drain region 14, and an STI insulating film 11 (thick insulating film) having a thickness that is larger than that of the gate insulating film 12 is formed in the trench 111. Next, constituent elements of the semiconductor device 1 according to the first embodiment are described.

The STI insulating film 11 is formed of an insulating film, for example, a silicon oxide film, that is thicker than the gate insulating film 12, and is a film that is similar to an element isolation film used in a CMOS logic circuit that is integrated at the same time. The STI insulating film 11 is an insulating film embedded in the trench 111 formed in the semiconductor substrate 10 and is surrounded by a first trench side surface 11c opposed to the body region 16, a trench bottom surface 11e, and a second trench side surface 11d opposed to the high-concentration drain region 14a in the cross-sectional view. A first corner portion 11a is formed at an intersecting portion at which the first trench side surface 11c and the trench bottom surface 11e meet, and a second corner portion 11b is formed at an intersecting portion at which the second trench side surface 11d and the trench bottom surface 11e meet. Each of the first corner portion 11a and the second corner portion 11b has an interior angle from about 90° to about 110° depending on trench etching conditions. This angle is acuter than the angle at the similar position of the LOCOS insulating film.

The high-concentration drain region 14a is formed in a region in the first drain drift-region 14b that is away from the body region 16, the first trench side surface 11c, and the trench bottom surface 11e, and is connected to a drain electrode wiring (not shown) to which a drain voltage is applied. The high-concentration drain region 14a is formed of n-type impurities having a high impurity concentration of $1 \times 10^{20}$ (P/cm$^3$) or more in order to obtain an ohmic contact with the drain electrode wiring.

The first drain drift-region 14b is formed in contact with the body region 16, the first trench side surface 11c, and a portion of the trench bottom surface 11e including the first corner portion 11a. Moreover, the first drain drift-region 14b is formed of n-type impurities having an impurity concentration that is lower than that of the body region 16 so as to withstand the p-n junction breakdown with the body region 16 against application of a high drain voltage. Moreover, the depth and the impurity concentration of the first drain drift-region 14b is adjusted so that upward extension on the first drain drift-region 14b side of the depletion layer that is generated between the first drain drift-region 14b and the p-type semiconductor substrate 10 below the first drain drift-region 14b reaches the trench bottom surface 11e when the drain voltage is applied. The reduced surface field (RESURF) effect of facilitating lateral extension of the depletion layer that expands from the boundary between the first drain drift-region 14b and the body region 16 into the first drain drift-region 14b is thereby obtained to reduce a drain electric field when the drain voltage is applied. A p-type region below the first drain drift-region 14b for obtaining the RESURF effect may be a p-type diffusion region formed in the semiconductor substrate 10.

The second drain drift-region 14c is formed in a region in the first drain drift-region 14b that is away from the body region 16 and is formed of n-type impurities having an impurity concentration that is higher than that of the first drain drift-region 14b. A distance between the second drain drift-region 14c and the body region 16 is set in consideration of the extension of the depletion layer and the like in order not to compromise the required drain breakdown voltage. Further, the second drain drift-region 14c is formed in contact with the trench bottom surface 11e to extend from a first position 11f which is away from the first corner portion 11a by a distance $x_1$ in the direction of the second corner portion 11b.

The impurity concentration of the first drain drift-region 14b is set low to reduce the drain electric field in the drain current concentrating portion generated near the first corner portion 11a. Moreover, with the impurity concentration of the second drain drift-region 14c being set higher than that of the first drain drift-region 14b, a drain resistance is reduced.

The gate electrode 13 is an electrode for controlling formation of a channel at a surface of the body region 16 through the gate insulating film 12 and is connected to a gate metal wiring (not shown). The gate electrode 13 is formed over the semiconductor substrate 10 including the body region 16 and over the STI insulating film 11.

The source region 15 is formed in the body region 16 and is connected to a source electrode wiring (not shown) to which a source voltage is applied. The source region 15 is formed of n-type impurities having a high impurity concentration of $1\times10^{20}/cm^3$ or more in order to obtain an ohmic contact with the source electrode wiring.

The body region 16 is a p-type impurity region for forming the channel on the surface of the semiconductor substrate 10 and is applied with a body voltage from a body electrode wiring through the body contact region 17 containing high-concentration p-type impurities. In general, the body voltage is often set equal to the source voltage. In that case, the body contact region 17 and the source region are formed adjacent to each other, and the source electrode wiring is connected collectively on the body contact region 17 and the source region.

In the first embodiment, the concentration of the drain current near the first corner portion 11a occurs as in the related art. However, with the impurity concentration of the first drain drift-region 14b that is reduced as compared to the related art, the electric field in the depletion layer generated by the application of the drain voltage in the first corner portion 11a is weakened as compared to the related art. The generation of the hot carriers in the first corner portion 11a and the hot-carrier degradation are therefore suppressed.

Meanwhile, the second drain drift-region 14c having the impurity concentration that is higher than that of the first drain drift-region 14b is formed from the first position 11f which is away from the first corner portion 11a by the distance $x_1$ to extend in the direction of the second corner portion 11b. The increase in drain resistance accompanying the reduction in impurity concentration of the first drain drift-region 14b is therefore suppressed.

With this configuration, according to the first embodiment, the higher breakdown voltage of the drain voltage through the reduction in concentration of the first drain drift-region 14b, and the reduction in on-resistance on the basis of the reduction in drain resistance with the configuration of the second drain drift-region 14c, as well as the increase in long-term reliability through suppression of the hot-carrier degradation, are achieved.

Figure 2A:
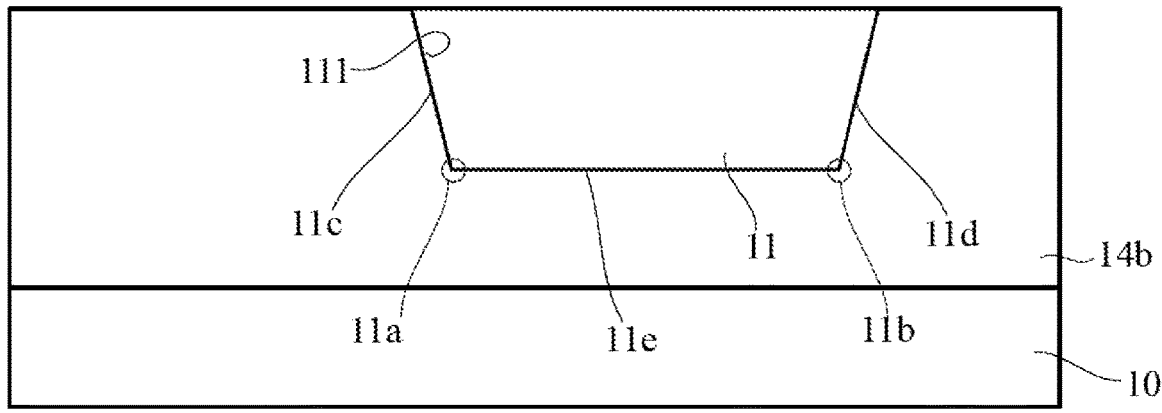
FIG. 2A, FIG. 2B, and FIG. 2C are cross-sectional views for illustrating manufacturing steps for the semiconductor device according to the first embodiment.
Figure 2B:
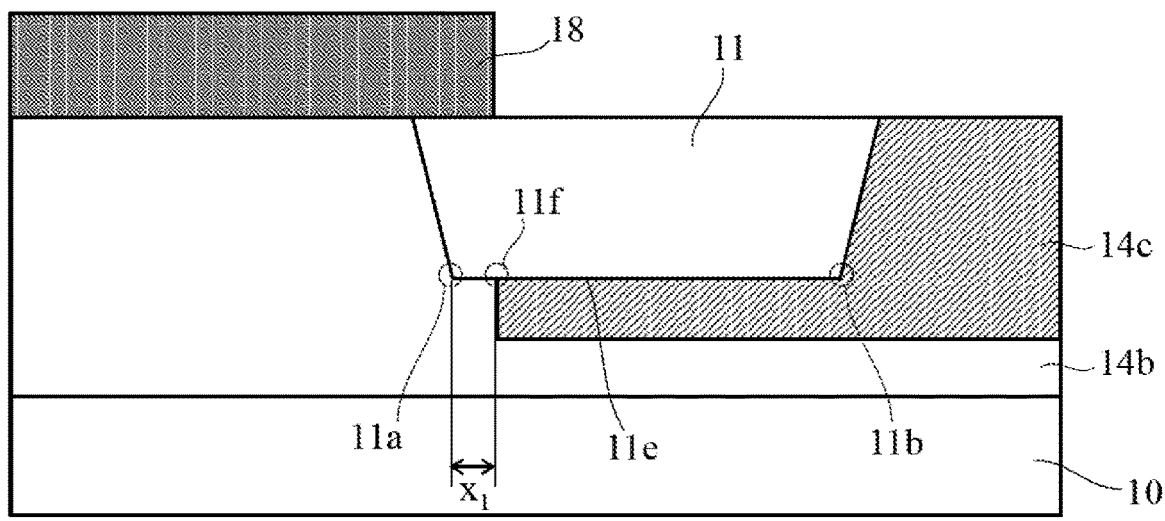
Figure 2C:
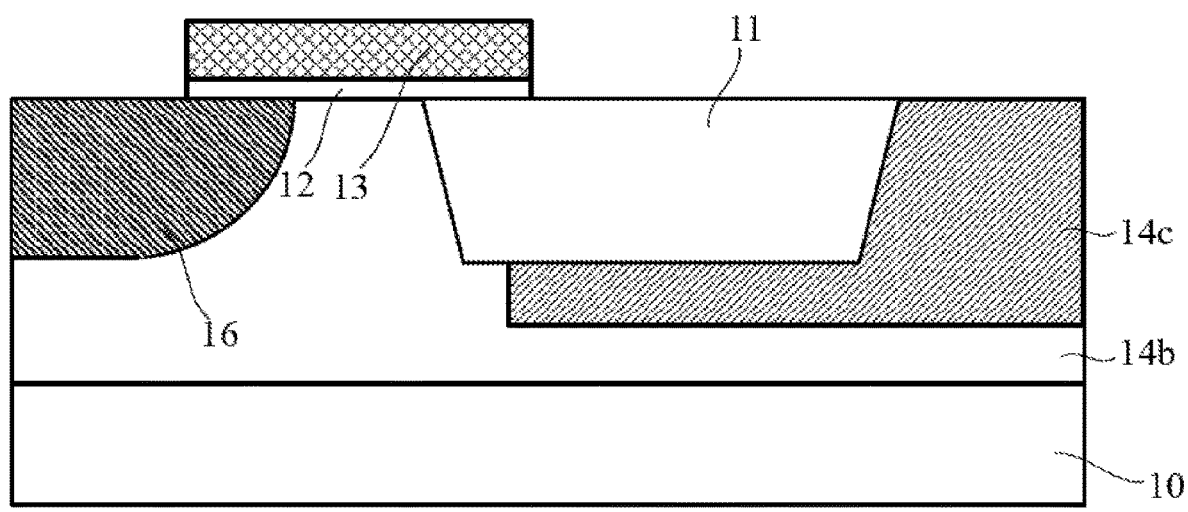

Next, referring to FIG. 2A to FIG. 2C, a method of manufacturing the semiconductor device 1 according to the first embodiment is described mainly in terms of characteristic steps.

First, as illustrated in FIG. 2A, the n-type first drain drift-region 14b is formed from the surface of the p-type semiconductor substrate 10 through ion implantation and thermal diffusion of the n-type impurities. Next, a mask insulating film is deposited, and the mask insulating film is subjected to etching to form an opening portion in the mask insulating film and expose the surface of the semiconductor substrate 10 (not shown). Then, etching is performed from the surface of the semiconductor substrate 10 to a depth that does not exceed that of the first drain drift-region 14b through use of the mask insulating film as a mask, to thereby form the trench 111. Then, a silicon oxide film or other insulating film is deposited on the resultant and is planarized by a chemical mechanical polishing (CMP) method or other method to form the STI insulating film 11 in the trench 111. The STI insulating film 11 is surrounded by the first trench side surface 11c, the first corner portion 11a formed by the second trench side surface 11d and the trench bottom surface 11e and the intersecting portion between the second trench side surface 11d and the trench bottom surface 11e, and the second corner portion 11b, and has a thickness from about 350 nm to about 450 nm which is larger than that of the gate insulating film which is formed later.

Next, as illustrated in FIG. 2B, the surface of the semiconductor substrate 10 is coated with a resist 18 which is patterned by the photolithography technology to form a resist opening portion in the second drain drift-region 14c from the first position 11f which is away from the first corner portion 11a by the distance $x_1$ in the direction toward the second corner portion 11b. The patterning of the resist 18 is performed in alignment with an alignment mark formed in the same layer as the STI insulating film 11. In this manner, misalignment of the distance $x_1$ between the first corner portion 11a and the second drain drift-region 14c is suppressed. Next, n-type impurities of a concentration that is higher than that of the first drain drift-region 14b are ion-implanted through use of the resist 18 as a mask to form the second drain drift-region 14c. At this time, high ion implantation energy for forming the second drain drift-region 14c below the trench bottom surface 11e to a depth that does not exceed that of the first drain drift-region 14b is selected. To this end, a thickness of the resist 18 is also selected to withstand the energy. Through the above-mentioned process, the second drain drift-region 14c is formed from the first position 11f which is away from the first corner portion 11a by the distance $x_1$ in the direction toward the second corner portion 11b in a region including a region in which the high-concentration drain region 14a is later formed.

Next, as illustrated in FIG. 2C, the p-type body region 16, the gate insulating film 12, and the gate electrode 13 are formed. The body region 16 may be formed after the formation of the gate electrode 13, by implanting and then thermally diffusing p-type impurities in self-alignment through use of the gate electrode 13 as a mask.

Thereafter, the n-type high-concentration drain region 14a and the n-type source region 15, and the p-type body contact region 17 are formed, and the semiconductor device 1 illustrated in FIG. 1 is completed.

Through adopting the above-mentioned manufacturing method, it is possible to produce the semiconductor device in which the variation in distance $x_1$ between the first corner portion 11a and the first position 11f is reduced, and in which the variation in effect of suppressing the hot-carrier degradation is reduced.

Second Embodiment

Now, a semiconductor device and a method of manufacturing the same according to a second embodiment of the present invention are described.

Figure 3:
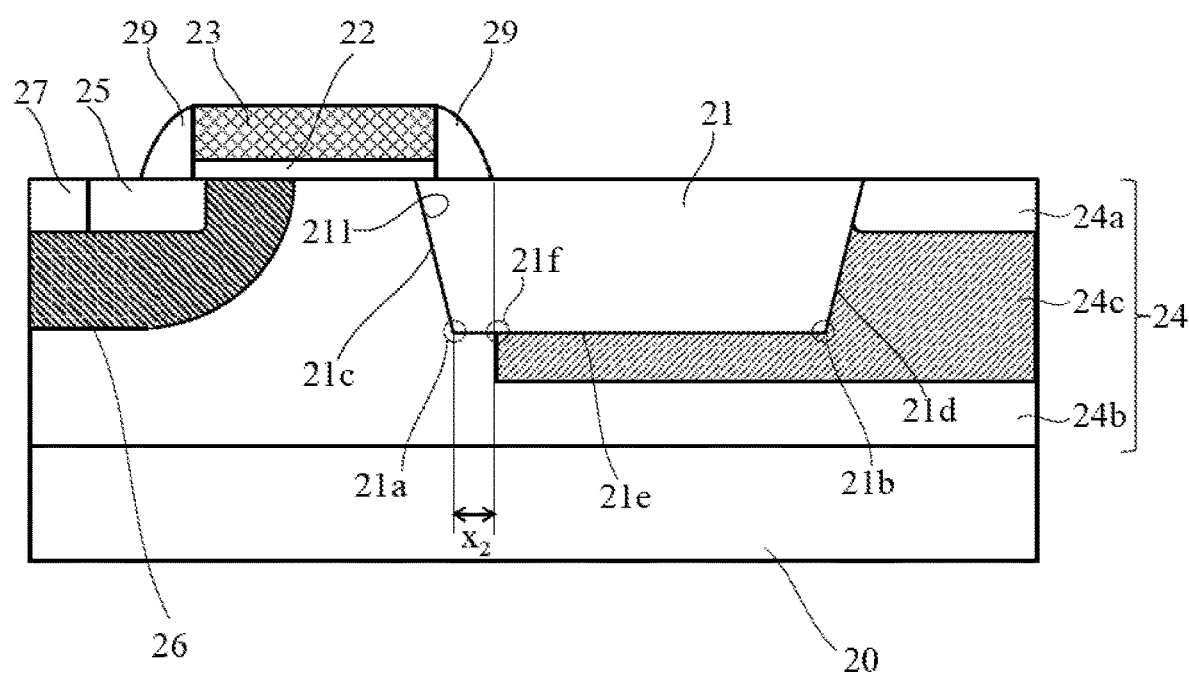
FIG. 3 is a cross-sectional view of a semiconductor device according to a second embodiment of the present invention.

FIG. 3 is a cross-sectional view of a semiconductor device 2 according to the second embodiment of the present invention.

The semiconductor device 2 according to the second embodiment is formed on a semiconductor substrate 20 made of p-type silicon, for example, and includes an n-type drain region 24 and an n-type source region 25, a p-type body region 26 formed between the drain region 24 and the source region 25, a p-type body contact region 27 formed on the body region 26, a gate insulating film 22, and a gate electrode 23. The drain region 24 includes a high-concentration drain region 24a, a first drain drift-region 24b, and a second drain drift-region 24c. Moreover, a trench 211 is formed in the drain region 24, and an STI insulating film 21 having a thickness that is larger than that of the gate insulating film 22 is formed in the trench 211. In the second embodiment, sidewall insulating films 29 are formed on the STI insulating film 21 in contact with both side surfaces of the gate electrode 23. Now, characteristic portions in the second embodiment as compared to the first embodiment are mainly described.

The second drain drift-region 24c is formed in a region in the first drain drift-region 24b that is away from the body region 26 and is formed of n-type impurities having an impurity concentration that is higher than that of the first drain drift-region 24b. A distance between the second drain drift-region 24c and the body region 26 is set in consideration of the extension of the depletion layer and the like in order not to compromise the required drain breakdown voltage. Further, in order to reduce a drain electric field at a first corner portion 21a, the second drain drift-region 24c is formed in contact with a trench bottom surface 21e to extend from a first position 21f which is away from the first corner portion 21a by a distance $x_2$ in the direction of a second corner portion 21b. Moreover, through setting an impurity concentration of the second drain drift-region 24c higher than that of a first drain drift-region 24b, the drain resistance is reduced.

The sidewall insulating films 29 are formed in contact with the both side surfaces of the gate electrode 23. Of the sidewall insulating films 29, the sidewall insulating film 29 formed in contact with the side surface opposed to the high-concentration drain region 24a is formed on the STI insulating film 21. Then, a position of an end portion of the sidewall insulating film 29 that is opposed to the high-concentration drain region 24a is substantially the same as the first position 21f as seen in plan view. In the second embodiment, the sidewall insulating film 29 serves as a mask in ion implantation for forming the second drain drift-region 24c.

In the second embodiment, the concentration of the drain current near the first corner portion 21a also occurs as in the related art. However, with the impurity concentration of the first drain drift-region 24b that is reduced as compared to the related art, the generation of the hot carriers and the hot-carrier degradation are suppressed. Further, the second drain drift-region 24c having the impurity concentration that is higher than that of the first drain drift-region 24b is formed from the first position 21f which is away from the first corner portion 21a by the distance $x_2$ to extend in the direction of the second corner portion 21b. The increase in drain resistance accompanying the reduction in impurity concentration of the first drain drift-region 24b is therefore suppressed.

With this configuration, according to the second embodiment, the higher breakdown voltage of the drain voltage through the reduction in concentration of the first drain drift-region 24b, and the reduction in on-resistance on the basis of the reduction in drain resistance with the configuration of the second drain drift-region 24c, as well as the increase in long-term reliability through suppression of the hot-carrier degradation, are achieved.

Figure 4A:
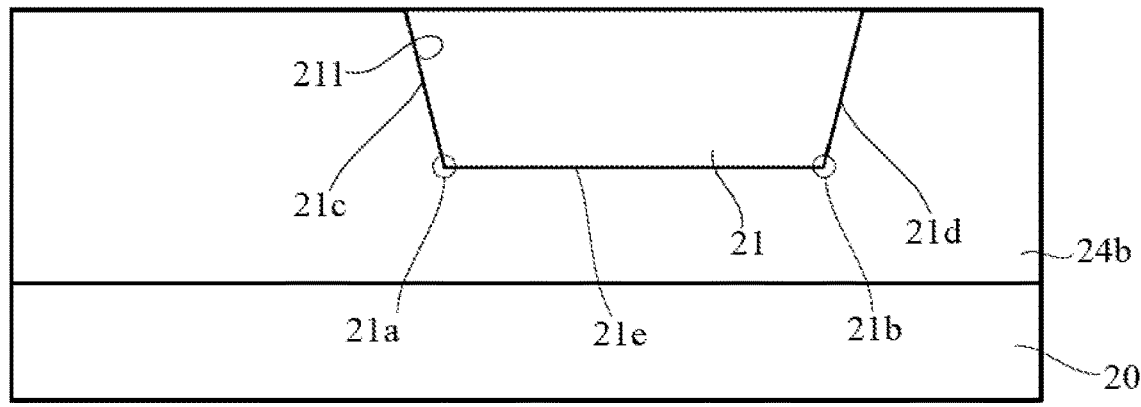
FIG. 4A, FIG. 4B, and FIG. 4C are cross-sectional views for illustrating manufacturing steps for the semiconductor device according to the second embodiment.
Figure 4B:
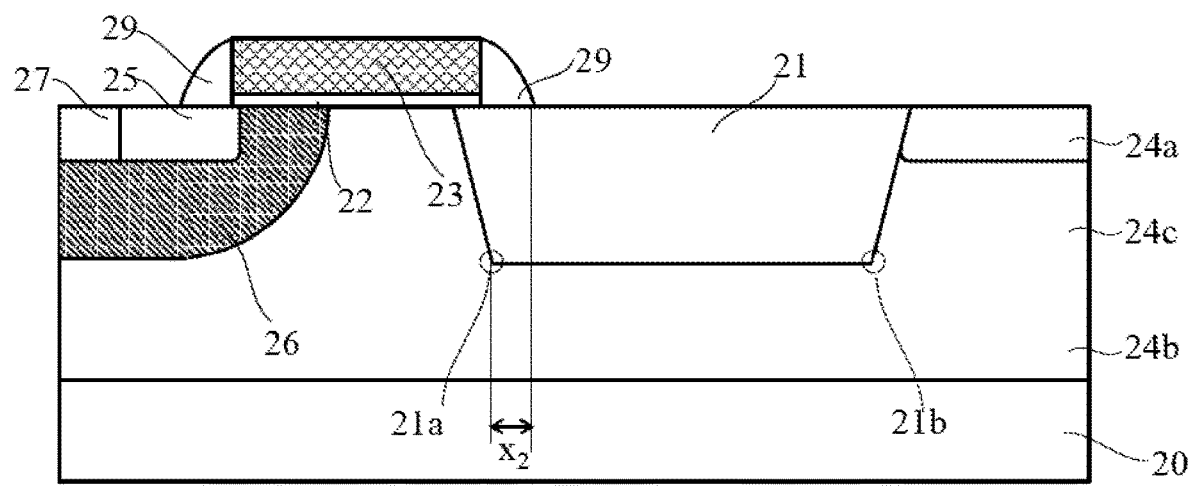
Figure 4C:
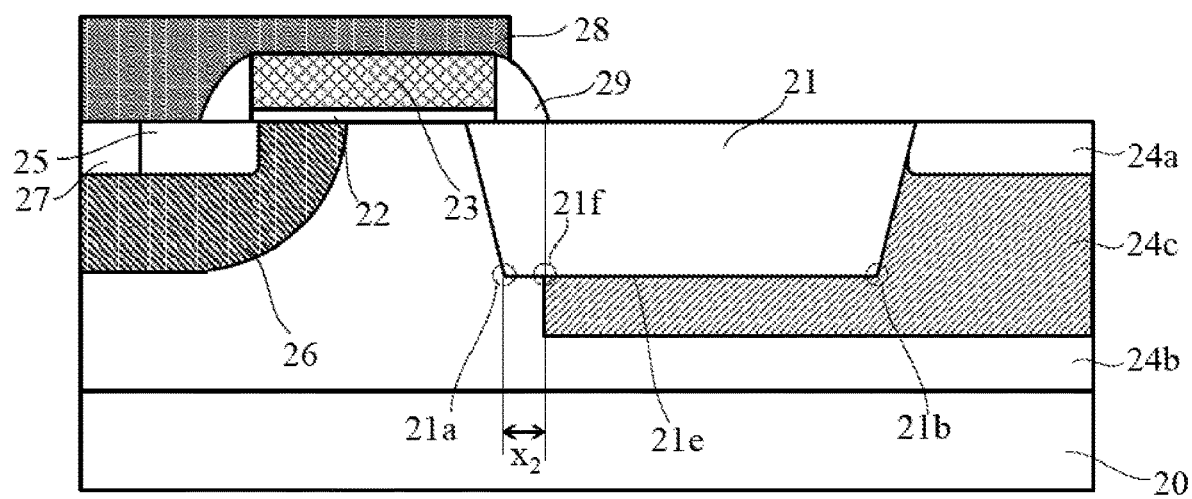

Next, referring to FIG. 4A to FIG. 4C, a method of manufacturing the semiconductor device 2 according to the second embodiment is described mainly in terms of characteristic steps.

First, as illustrated in FIG. 4A, the n-type first drain drift-region 24b is formed from the surface of the p-type semiconductor substrate 20 through ion implantation and thermal diffusion of the n-type impurities. Next, a mask insulating film is deposited, and the mask insulating film is subjected to etching to form an opening portion in the mask insulating film and expose the surface of the semiconductor substrate 20 (not shown). Then, etching is performed from the surface of the semiconductor substrate 20 to a depth that does not exceed that of the first drain drift-region 24b through use of the mask insulating film as a mask, to thereby form the trench 211. Then, a silicon oxide film or other insulating film is deposited on the resultant and is planarized by a CMP method or other method to form the STI insulating film 21 in the trench 211. The STI insulating film 21 is surrounded by the first trench side surface 21c, the first corner portion 21a formed by the second trench side surface 21d and the trench bottom surface 21e and the intersecting portion between the second trench side surface 21d and the trench bottom surface 21e, and the second corner portion 21b, and has a thickness from about 350 nm to about 450 nm which is thicker than that of the gate insulating film which is formed later. This step is similar to that of the first embodiment.

Next, as illustrated in FIG. 4B, the body region 26, the gate insulating film 22, the gate electrode 23, the high-concentration drain region 24a, the source region 25, and the body contact region 27 are formed. Then, an insulating film, for example, a silicon oxide film is formed on the gate electrode 23 and is etched back under anisotropic dry etching conditions to form the sidewall insulating films 29 in contact with the both side surfaces of the gate electrode 23. The body region 26 may be formed after the formation of the gate insulating film 22 and the gate electrode 23, by implanting and then thermally diffusing p-type impurities in self-alignment through use of the gate electrode 23 as a mask.

The patterning of the gate electrode 23 is performed in alignment with an alignment mark formed in the same layer as the STI insulating film 21. In this manner, misalignment between the first corner portion 21a and the end portion of the gate electrode 23 on the high-concentration drain region 24a side is suppressed. Further, a variation in distance $x_2$ between the first corner portion 21a and the end portion of the sidewall insulating film 29 formed on the side surface of the gate electrode 23 on the high-concentration drain region 24a side is suppressed in the same manner.

Next, as illustrated in FIG. 4C, a resist 28 is applied on the surface of the semiconductor substrate 20, and a resist opening portion is formed by the photolithography technology in a region including a region in which the second drain drift-region 24c is formed later. A boundary position of the resist opening portion is set to a suitable position on the sidewall insulating film 29 on the side surface of the gate electrode 23 that is opposed to the high-concentration drain region 24a. Next, n-type impurities of a concentration that is higher than that of the first drain drift-region 24b are ion-implanted through use of the resist 28 and the sidewall insulating film 29 as masks to form the second drain drift-region 24c.

At this time, ion implantation energy is selected high enough as to be able to form the second drain drift-region 24c below the trench bottom surface 21e to a depth that does not exceed that of the first drain drift-region 24b. Through the above-mentioned process, the second drain drift-region 24c is formed from the first position 21f which is away from the first corner portion 21a by the distance $x_2$ in the direction toward the second corner portion 21b in a region including a region in which the high-concentration drain region 24a is formed later.

Thereafter, the resist 28 is removed, and the semiconductor device 2 illustrated in FIG. 3 is completed.

Through adopting the above-mentioned manufacturing method, the variation in distance $x_2$ between the first corner portion 21a and the first position 21f can be reduced. When the variation in distance $x_2$ is decomposed, misalignment between the trench 211 and the second drain drift-region is first given as the first variation component. The first variation component is equivalent to misalignment between the trench 111 and the resist 18 in the first embodiment. The second variation component is a variation in finishing of an ion implantation mask boundary at the time when the second drain drift-region is formed by ion implantation, and in the second embodiment, high effect of reducing the variation is obtained.

The boundary of the ion implantation mask adopted in the second embodiment is the end portion of the sidewall insulating films 29 formed in self-alignment based on the gate electrode 23 formed through use of a thin resist. In general, it is considered that, as the resist for patterning becomes thicker, it becomes more easily affected by the effects of variations in pattern density and taper angle of the pattern boundary, and a variation in finishing of the pattern boundary becomes larger. The variation in finishing of the end portion of the sidewall insulating film 29 that is formed in self-alignment based on the gate electrode 23 formed through use of the thin resist can therefore be reduced as compared to the variation in finishing of the boundary of the resist having a large thickness.

Through adopting the above-mentioned manufacturing method, it is possible to produce the semiconductor device in which the variation in distance $x_2$ between the first corner portion 21a and the first position 21f is reduced, and in which the variation in effect of suppressing the hot-carrier degradation is reduced.

Third Embodiment

Now, a semiconductor device and a method of manufacturing the same according to a third embodiment of the present invention are described.

Figure 5:
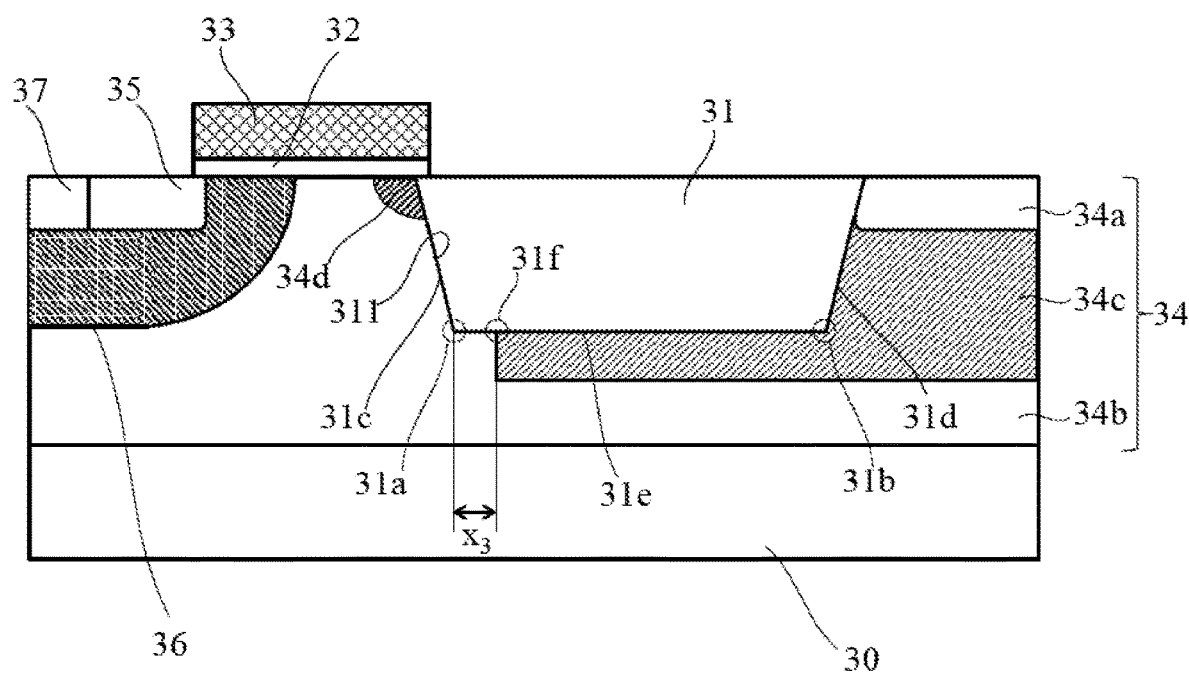
FIG. 5 is a cross-sectional view of a semiconductor device according to a third embodiment of the present invention.

FIG. 5 is a cross-sectional view of a semiconductor device 3 according to the third embodiment of the present invention.

The semiconductor device 3 according to the third embodiment is formed on a semiconductor substrate 30 made of p-type silicon, for example, and includes an n-type drain region 34 and an n-type source region 35, a p-type body region 36 formed between the drain region 34 and the source region 35, a p-type body contact region 37 formed on the body region 36, a gate insulating film 32, and a gate electrode 33. The drain region 34 includes, in addition to a high-concentration drain region 34a, a first drain drift-region 34b, and a second drain drift-region 34c, a surface drain drift-region 34d. A trench 311 is formed in the drain region 34, and an STI insulating film 31 having a thickness that is larger than that of the gate insulating film 32 is formed in the trench 311. Now, characteristic portions of the third embodiment as compared to the first embodiment are mainly described.

The surface drain drift-region 34d is in contact with a first trench side surface 31c and is formed from below the gate insulating film 32 in a region at a depth that is shallower than that of a first corner portion 31a. Moreover, the surface drain drift-region 34d is formed of n-type impurities of an impurity concentration that is higher than that of the first drain drift-region 34b.

A side surface of the gate electrode 33 that is opposed to the high-concentration drain region 34a is set to a position that slightly overlaps with the STI insulating film 31. This position is a slightly overlapping position at which the surface drain drift-region 34d can be formed by ion-implanting at an inclination angle of 15° or more from a vertical direction through the side surface of the gate electrode 33.

In the third embodiment, the surface drain drift-region 34d is formed to reduce the drain resistance. In this region, a drain electric field is relatively high, but the drain current density is not high, with the result that the hot carriers are hardly generated. An electric current flowing through this portion flows while meandering as indicated by the path "a" of FIG. 13, and hence an equivalent electric resistance becomes high. In the third embodiment, the surface drain drift-region 34d is therefore formed to reduce the drain resistance. Moreover, as in the first embodiment, the second drain drift-region 34c having an impurity concentration that is higher than that of the first drain drift-region 34b is formed to extend from a first position 31f which is away from the first corner portion 31a by a distance $x_3$ on the high-concentration drain region 34a side.

Accordingly, according to the third embodiment, the higher breakdown voltage of the drain voltage through the reduction in concentration of the first drain drift-region 34b, and the reduction in on-resistance on the basis of the reduction in drain resistance with the configuration of the surface drain drift-region 34d and the second drain drift-region 34c, as well as the increase in long-term reliability through suppression of the hot-carrier degradation, are achieved.

Figure 6A:
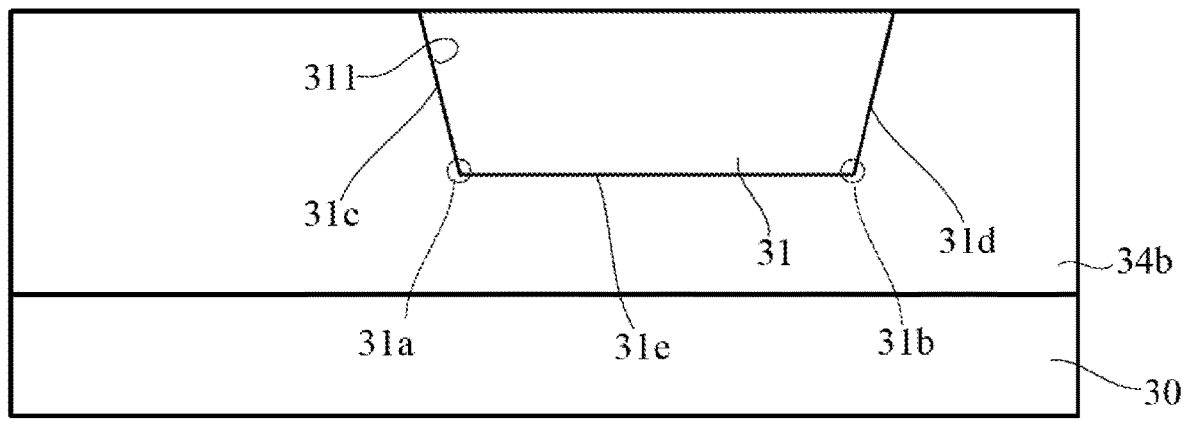
FIG. 6A, FIG. 6B, and FIG. 6C are cross-sectional views for illustrating manufacturing steps for the semiconductor device according to the third embodiment.
Figure 6B:
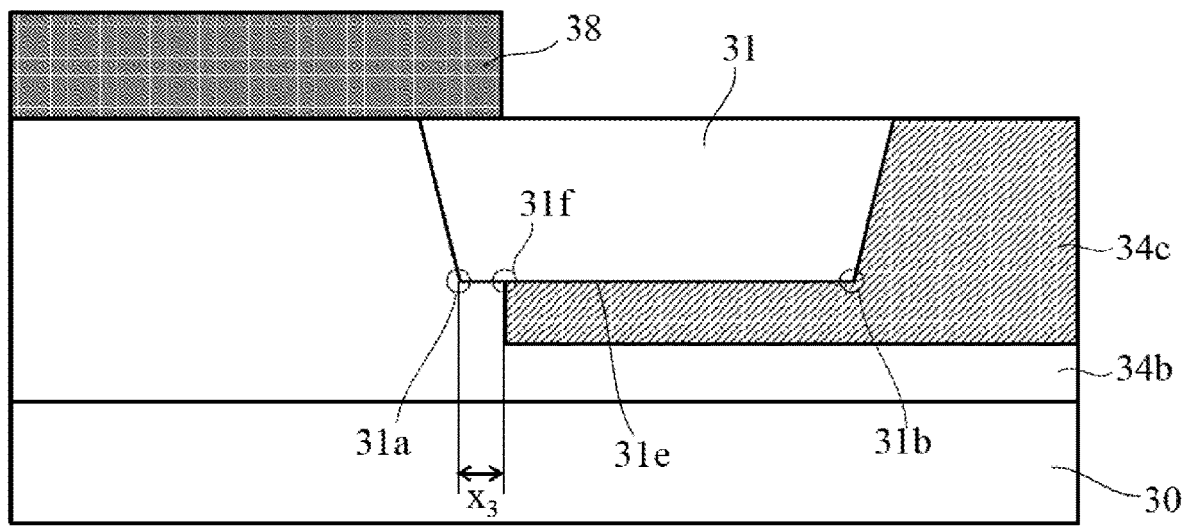
Figure 6C:
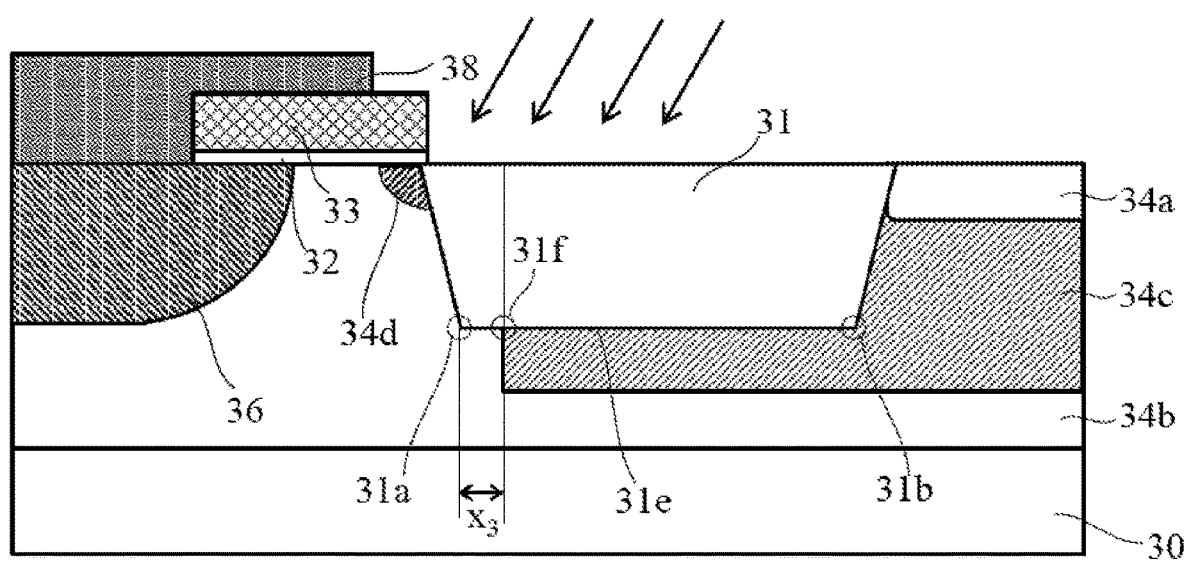

Next, referring to FIG. 6A to FIG. 6C, a method of manufacturing the semiconductor device 3 according to the third embodiment is described mainly in terms of characteristic steps.

First, as illustrated in FIG. 6A, the n-type first drain drift-region 34b is formed from the surface of the p-type semiconductor substrate 30 through ion implantation and thermal diffusion of the n-type impurities. Next, a mask insulating film is deposited, and the mask insulating film is subjected to etching to form an opening portion in the mask insulating film and expose the surface of the semiconductor substrate 30 (not shown). Then, etching is performed from the surface of the semiconductor substrate 30 to a depth that does not exceed that of the first drain drift-region 34b through use of the mask insulating film as a mask, to thereby form the trench 311. Then, a silicon oxide film or other insulating film is deposited on the resultant and is planarized by a CMP method or other method to form the STI insulating film 31 in the trench 311. The STI insulating film 31 is surrounded by the first trench side surface 31c, the first corner portion 31a formed by the second trench side surface 31d and the trench bottom surface 31e and the intersecting portion between the second trench side surface 31d and the trench bottom surface 31e, and the second corner portion 31b, and has a thickness from about 350 nm to about 450 nm which is thicker than that of the gate insulating film which is formed later. This step is similar to that of the first embodiment.

Next, as illustrated in FIG. 6B, a resist 38 is applied on the surface of the semiconductor substrate 30, and a resist opening portion is formed by the lithography technology in a region in which the second drain drift-region 34c is formed later. The patterning of the resist 38 is performed in alignment with an alignment mark formed in the same layer as the STI insulating film 31. Therefore, misalignment of the distance $x_3$ between the first corner portion 31a and the first position 31f is suppressed, and hence a length of the distance $x_3$ can be reduced in a range in which the second drain drift-region 34c is not brought into contact with the first corner portion 31a. The distance $x_3$ is reduced to reduce the drain resistance.

Next, n-type impurities of a concentration that is higher than that of the first drain drift-region 34b are ion-implanted through use of the resist 38 as a mask to form the second drain drift-region 34c. At this time, high ion implantation energy for forming the second drain drift-region 34c below the trench bottom surface 31e to a depth that does not exceed that of the first drain drift-region 34b is selected. Through the above-mentioned process, the second drain drift-region 34c is formed from the first position 31f which is away from the first corner portion 31a by the distance $x_3$ in the direction toward the second corner portion 31b in a region including a region in which the high-concentration drain region 34a is formed later.

Next, as illustrated in FIG. 6C, after the resist 38 is removed, the p-type body region 36, the gate insulating film 32, and the gate electrode 33 are formed. The body region 36 may be formed after the formation of the gate electrode 33, by implanting and then thermally diffusing p-type impurities in self-alignment through use of the gate electrode 33 as a mask.

Next, the resist 38 is applied on the surface of the semiconductor substrate 30, and a resist opening portion is formed by the photolithography technology in a region in which ion implantation is to be performed for forming the surface drain drift-region 34d. A boundary portion of the resist opening portion is set to a suitable position at which an end portion of the gate electrode 33 on the side of a region in which the high-concentration drain region 34a is formed later is exposed. Next, n-type impurities of a concentration that is higher than that of the first drain drift-region 34b are ion-implanted with an inclination at an angle of 15° or more through use of the resist 38 and the gate electrode 33 as masks, to thereby form the surface drain drift-region 34d.

Thereafter, the n-type high-concentration drain region 34a and the n-type source region 35, and the p-type body contact region 37 are formed, and the semiconductor device 3 illustrated in FIG. 5 is completed.

Through adopting the above-mentioned manufacturing method, the surface drain drift-region 34d can be formed in self-alignment with respect to the position of the trench 311, with the result that the drain resistance in this region can be reduced, and that the variation in drain resistance can be suppressed. Through the formation of the second drain drift-region 34c and the surface drain drift-region 34d, the on-resistance can therefore be reduced stably while the hot-carrier degradation is suppressed.

Fourth Embodiment

Now, a semiconductor device and a method of manufacturing the same according to a fourth embodiment of the present invention are described.

Figure 7:
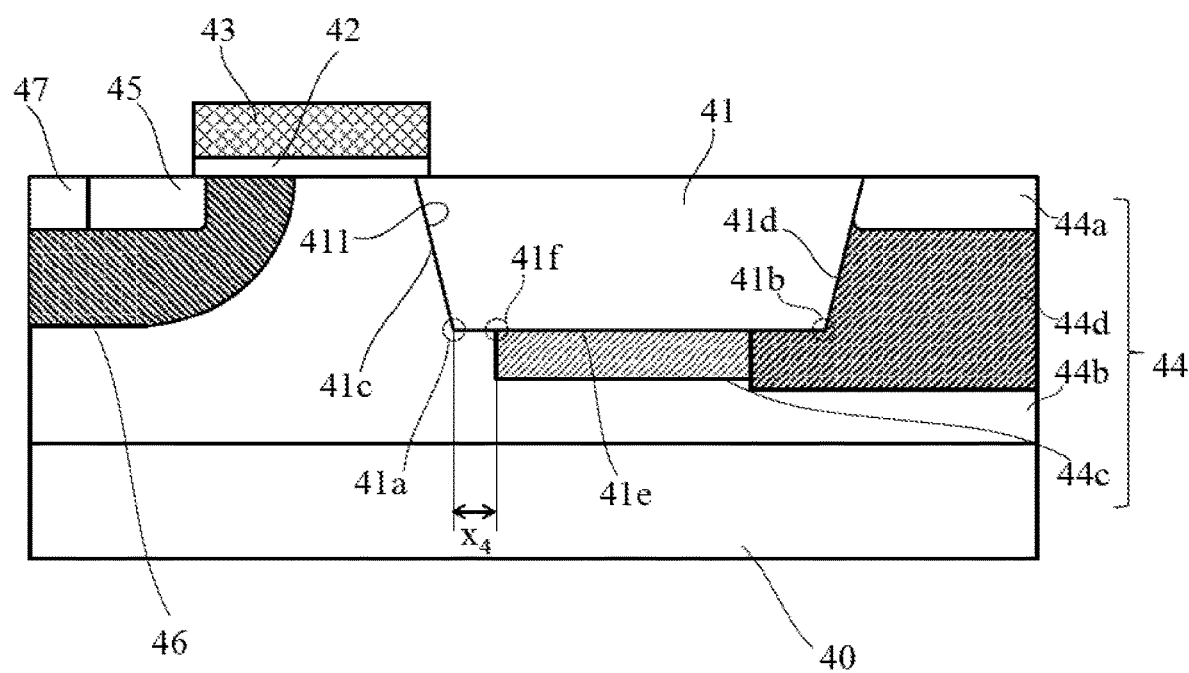
FIG. 7 is a cross-sectional view of a semiconductor device according to a fourth embodiment of the present invention.

FIG. 7 is a cross-sectional view of a semiconductor device 4 according to the fourth embodiment of the present invention.

The semiconductor device 4 according to the fourth embodiment is formed on a semiconductor substrate 40 made of p-type silicon, for example, and includes an n-type drain region 44 and an n-type source region 45, a p-type body region 46 formed between the drain region 44 and the source region 45, a p-type body contact region 47 formed on the body region 46, a gate insulating film 42, and a gate electrode 43. The drain region 44 includes a high-concentration drain region 44a, a first drain drift-region 44b, a second drain drift-region 44c, and a third drain drift-region 44d. Moreover, a trench 411 is formed in the drain region 44, and an STI insulating film 41 having a thickness that is larger than that of the gate insulating film 42 is formed in the trench 411. Now, characteristic portions in the fourth embodiment as compared to the first embodiment are mainly described.

The second drain drift-region 44c is formed in a region in the first drain drift-region 44b that is away from the body region 46 and is formed of n-type impurities having an impurity concentration that is higher than that of the first drain drift-region 44b. A distance between the second drain drift-region 44c and the body region 46 is set in consideration of the extension of the depletion layer and the like in order not to compromise the required drain breakdown voltage. Further, in order to reduce a drain electric field in the drain current concentrating portion generated near a first corner portion 41a, the second drain drift-region 44c is formed in contact with a trench bottom surface 41e to extend from a first position 41f which is away from the first corner portion 41a by a distance $x_4$ in the direction of a second corner portion 41b.

The third drain drift-region 44d is formed in the first drain drift-region 44b in contact with the second drain drift-region 44c and in a region including the high-concentration drain region 44a and the second corner portion 41b as seen in plan view. Moreover, the third drain drift-region 44d is formed of n-type impurities of an impurity concentration that is higher than those of the first drain drift-region 44b and the second drain drift-region 44c.

In the semiconductor device 4 according to the fourth embodiment, the third drain drift-region 44d having the higher impurity concentration is formed in addition to the second drain drift-region 44c to reduce the drain resistance. In an electric field distribution in a depletion layer that extends from a boundary with the body region 46 into the first drain drift-region 44b through application of a voltage to the drain, an electric field at the boundary is the highest, and the electric field becomes lower as becoming farther away from the boundary. By an amount by which the electric field at the position of the second drain drift-region 44c is lower than the electric field at the boundary position with the body region 46, the impurity concentration can therefore be set higher than that of the first drain drift-region 44b.

Similarly, in the third drain drift-region 44d which is farther away from the boundary with the body region 46 the impurity concentration can be set higher than that of the second drain drift-region 44c, to thereby be able to reduce the drain resistance.

That is, with this configuration of FIG. 7, according to the fourth embodiment, the higher breakdown voltage of the drain voltage through the reduction in concentration of the first drain drift-region 44b, and the reduction in on-resistance on the basis of the reduction in drain resistance with the configuration of the second drain drift-region 44c and the third drain drift-region 44d, as well as the increase in long-term reliability through suppression of the hot-carrier degradation, are achieved.

Figure 8A:
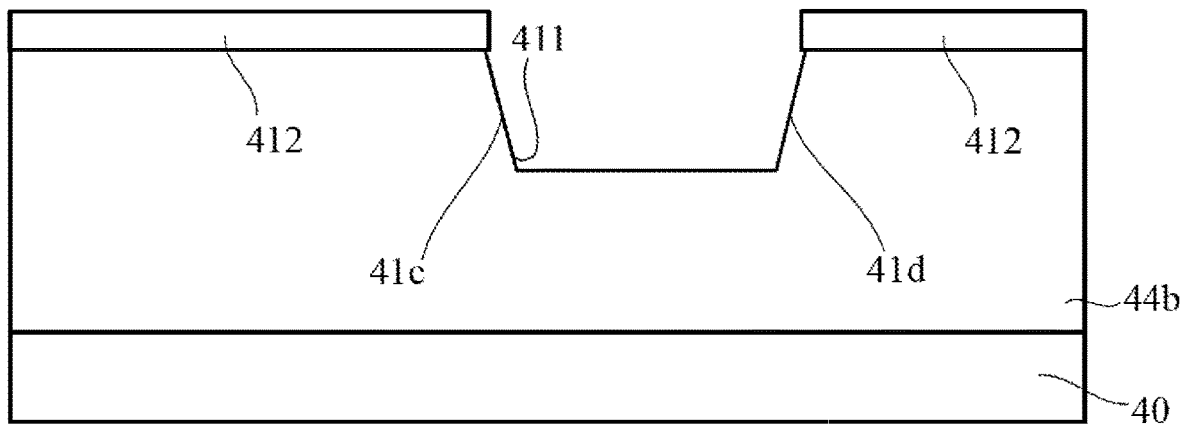
FIG. 8A, FIG. 8B, and FIG. 8C are cross-sectional views for illustrating manufacturing steps for the semiconductor device according to the fourth embodiment.
Figure 8B:
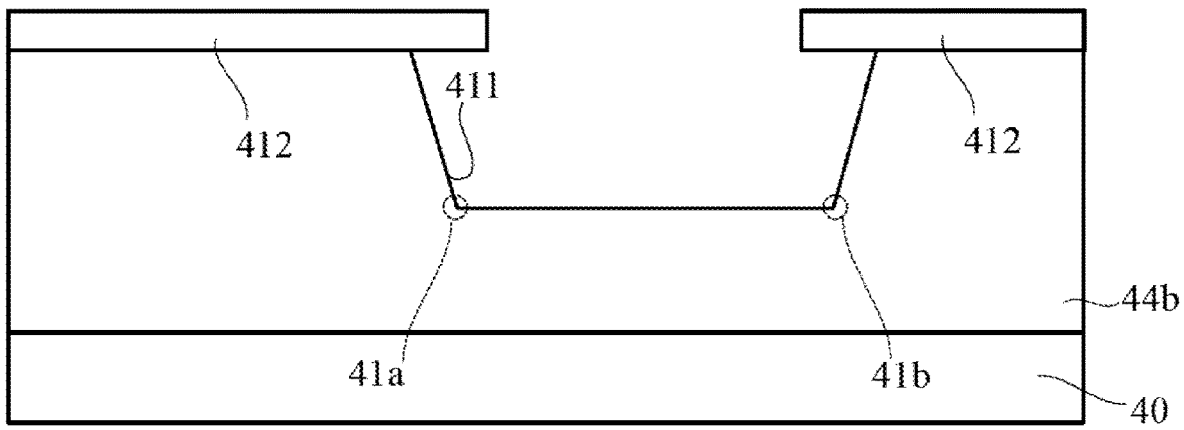
Figure 8C:
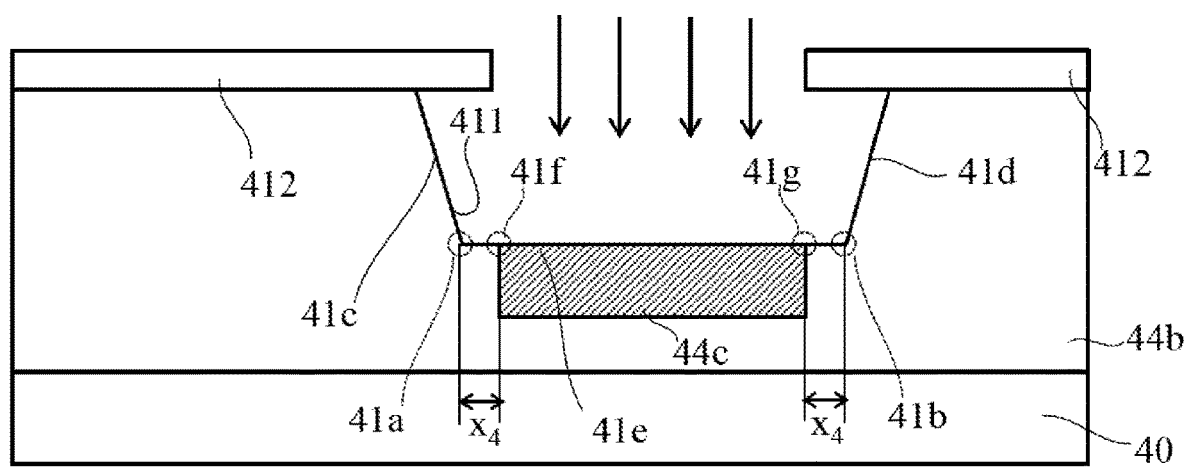

Next, referring to FIG. 8A to FIG. 8C, a method of manufacturing the semiconductor device 4 according to the fourth embodiment is described mainly in terms of characteristic steps.

First, as illustrated in FIG. 8A, the n-type first drain drift-region 44b is formed from the surface of the p-type semiconductor substrate 40 by ion-implanting and thermally diffusing n-type impurities. Next, a mask insulating film 412 for forming the trench 411 in the semiconductor substrate 40 is formed on the semiconductor substrate 40. As the mask insulating film 412, a film that can withstand trench etching to be subsequently performed is adopted. To that end, the mask insulating film 412 may be a laminate film of a silicon oxide film and a silicon nitride film, for example.

Next, the mask insulating film 412 in the region in which the trench 411 is formed later is etched to form an opening portion, and then the semiconductor substrate 40 is processed by an anisotropic dry etching method through use of the mask insulating film 412 as a mask to form the trench 411 below the opening portion. The anisotropic dry etching method is a technology for performing etching substantially in the vertical direction along the opening portion of the mask insulating film 412, and a reactive ion etching (RIE) method is known, for example. In this etching step, deposition of secondary products on the trench side surfaces also occurs at the same time, and hence, as illustrated in FIG. 8A, a first trench side surface 41c and a second trench side surface 41d often have a forward-tapered shape. However, such lateral etching that positions of the first trench side surface 41c and the second trench side surface 41d expand beyond the opening portion of the mask insulating film 412 is suppressed.

Next, as illustrated in FIG. 8B, additional etching is further performed from the state of FIG. 8A to deepen the trench 411, and at the same time, the etching of the trench is advanced so that the trench expands also in the lateral direction beyond ends of the opening portion of the mask insulating film 412. The purpose of this etching is to expand the first corner portion 41a and the second corner portion 41b beyond the opening portion of the mask insulating film 412 as seen in plan view. The etching at this time adopts isotropic dry etching conditions known as a chemical dry etching (CDE) method, for example. Through the above-mentioned additional etching, the trench 411 having the first corner portion 41a, the second corner portion 41b, the first trench side surface 41c, the second trench side surface 41d, and the trench bottom surface 41e is formed.

Next, as illustrated in FIG. 8C, n-type impurities are ion-implanted to the trench bottom surface 41e in the vertical direction illustrated by the solid-line arrows through use of the mask insulating film 412 as a mask to form the second drain drift-region 44c. At this time, with the first corner portion 41a and the second corner portion 41b expanding beyond the opening portion of the mask insulating film 412, the second drain drift-region 44c is formed between the first position 41f and a second position 41g away from the first corner portion 41a and the second corner portion 41b by distances $x_4$.

Moreover, in order to reduce the N-type [n-type??] impurity concentration in the first drain drift-region 44b near the first corner portion 41a, the second corner portion 41b, the first trench side surface 41c, and the second trench side surface 41d from the state of FIG. 8C, p-type impurities may be ion-implanted at an inclination angle of 15° or more from the vertical direction as required (not shown). Those n-type impurities are controlled to an impurity implantation amount that is smaller than that of the n-type impurities in the second drain drift-region 44c so as not to affect the impurity concentration of the second drain drift-region 44c.

Thereafter, the mask insulating film 412 is removed, and a silicon oxide film or other insulating film is deposited and planarized by the CMP method or other method to form the STI insulating film 41 in the trench 411. Next, a resist is applied on the surface of the semiconductor substrate 40 as in FIG. 2B, and a resist opening portion is formed by the photolithography technology in a region in which the third drain drift-region is formed later, including the second corner portion 41b and the second position 41g. Then, n-type impurities are ion-implanted in the resist opening portion (not shown).

At this time, high ion implantation energy for forming the third drain drift-region 44d below the trench bottom surface 41e to a depth that does not exceed that of the first drain drift-region 44b is selected. Then, the n-type impurities of the impurity concentration that is higher than the second drain drift-region 44c are implanted to form the third drain drift-region 44d. Then, after formation of the gate insulating film 42, formation of the gate electrode 43, formation of the body region 46, formation of the high-concentration drain region 44a and the source region 45, and the like, the semiconductor device 4 illustrated in FIG. 7 is completed.

In the method of manufacturing the semiconductor device according to the fourth embodiment, the additional etching and the implantation of the n-type impurities are performed through use of the mask insulating film 412 without using the photolithography technology, and hence the second drain drift-region 44c can be formed in self-alignment with the shape of the trench 411. The variation in distance $x_4$ in FIG. 7 can therefore be reduced, and the variation in effect of suppressing the hot-carrier degradation can be reduced.

Moreover, in the fourth embodiment, the implantation of the n-type impurities for forming the second drain drift-region 44c is performed on the trench bottom surface 41e before the STI insulating film 41 is formed. Expansion of an implantation range caused by performing ion implantation with low energy can therefore be reduced, and a variation in implantation depth based on a variation in thickness of the STI insulating film 41 can be reduced. Stable reduction in drain resistance can thus be achieved.

Fifth Embodiment

Figure 9:
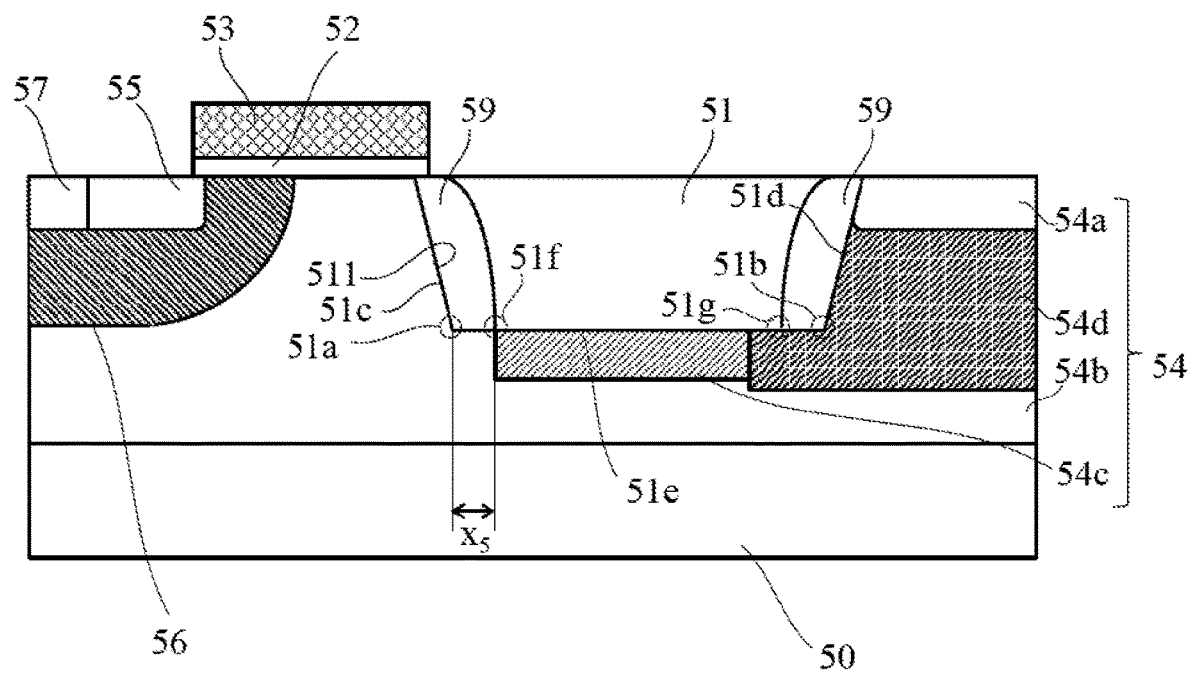
FIG. 9 is a cross-sectional view of a semiconductor device according to a fifth embodiment of the present invention.

FIG. 9 is a cross-sectional view of a semiconductor device 5 according to the fifth embodiment of the present invention.

The semiconductor device 5 according to the fifth embodiment is formed on a semiconductor substrate 50 made of p-type silicon, for example, and includes an n-type drain region 54 and an n-type source region 55, a p-type body region 56 formed between the drain region 54 and the source region 55, a p-type body contact region 57 formed on the body region 56, a gate insulating film 52, and a gate electrode 53. The drain region 54 includes a high-concentration drain region 54a, a first drain drift-region 54b, a second drain drift-region 54c, and a third drain drift-region 54d. Moreover, a trench 511 is formed in the drain region 54, and an STI insulating film 51 having a thickness that is larger than that of the gate insulating film 52 is formed in the trench 511. Further, in the fifth embodiment, sidewall insulating films 59 are formed in contact with a first trench side surface 51c and a second trench side surface 51d, respectively, outside the STI insulating film 51 in the trench 511. Now, characteristic portions in the fifth embodiment as compared to the first embodiment are mainly described.

The second drain drift-region 54c is formed in a region in the first drain drift-region 54b that is away from the body region 56 and is formed of n-type impurities having an impurity concentration that is higher than that of the first drain drift-region 54b. Further, in order to reduce a drain electric field in the drain current concentrating portion generated near a first corner portion 51a, the second drain drift-region 54c is formed in contact with a trench bottom surface 51e to extend from a first position 51f which is away from the first corner portion 51a by a distance $x_5$ in the direction of a second corner portion 51b.

The sidewall insulating films 59 are formed between a first corner portion 51a and a first position 51f and between a second corner portion 51b and a second position 51g on a trench bottom surface 51e to be in contact with the first trench side surface 51c and the second trench side surface 51d, respectively. The STI insulating film 51 is formed in contact with the sidewall insulating films 59 in the trench 511.

The third drain drift-region 54d is formed in the first drain drift-region 54b to be adjacent to the second drain drift-region 54c and in a region including the high-concentration drain region 54a, the second corner portion 51b, and the second position 51g as seen in plan view. Moreover, the third drain drift-region 54d is formed of n-type impurities of an impurity concentration that is higher than those of the first drain drift-region 54b and the second drain drift-region 54c.

In the fifth embodiment, as in the fourth embodiment, the second drain drift-region 54c extends from the first position 51f which is away from the first corner portion 51a by a distance $x_5$ in the direction of the second corner portion 51b, to thereby reduce a drain electric field near the first corner portion 51a and suppress the hot-carrier degradation. According to the fifth embodiment, the high drain breakdown voltage through the reduced concentration of the first drain drift-region 54b, and the reduction in on-resistance on the basis of the reduction in drain resistance with the configuration of the second drain drift-region 54c, as well as the increase in long-term reliability through suppression of the hot-carrier degradation, are therefore achieved.

Further, in the semiconductor device 5 according to the fifth embodiment, the third drain drift-region 54d having the higher impurity concentration than that of the second drain drift-region 54c is formed to reduce the drain resistance. In an electric field distribution in a depletion layer that extends from a boundary with the body region 56 into the first drain drift-region 54b through application of a voltage to the drain, a drain electric field at the boundary is the highest, and the drain electric field becomes lower as becoming farther away from the boundary. By an amount by which the drain electric field at the position of the second drain drift-region 54c is lower than the electric field at the boundary position with the body region 56, the impurity concentration can thus be set higher than that of the first drain drift-region 54b.

Similarly, in the third drain drift-region 54d which is farther away from the boundary with the body region 56 the impurity concentration can be set higher than that of the second drain drift-region 54c, to thereby be able to reduce the drain resistance.

That is, with this configuration of FIG. 9, according to the fifth embodiment, the higher breakdown voltage of the drain voltage through the reduction in concentration of the first drain drift-region 54b, and the reduction in on-resistance on the basis of the reduction in drain resistance with the configuration of the second drain drift-region 54c and the third drain drift-region 54d, as well as the increase in long-term reliability through suppression of the hot-carrier degradation, are achieved.

Figure 10A:
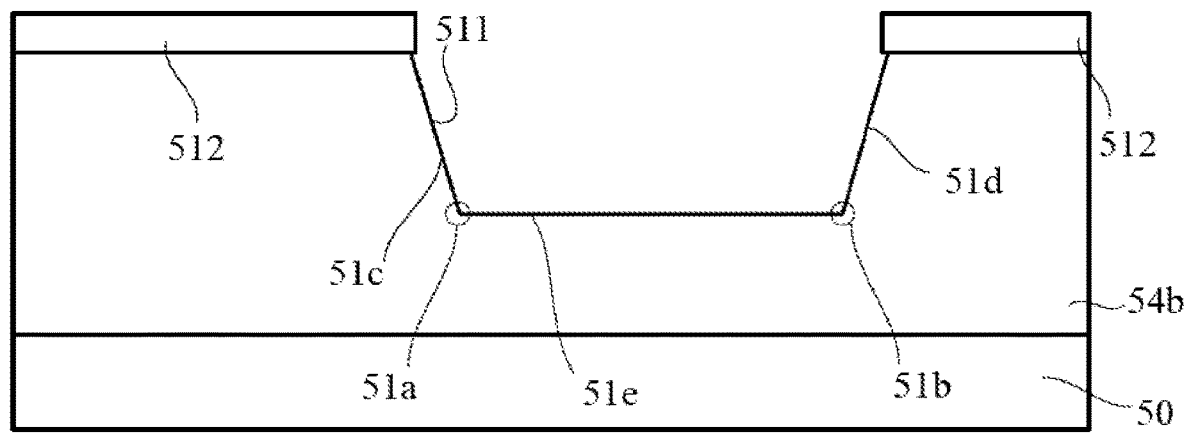
FIG. 10A, FIG. 10B, and FIG. 10C are cross-sectional views for illustrating manufacturing steps for the semiconductor device according to the fifth embodiment.
Figure 10B:
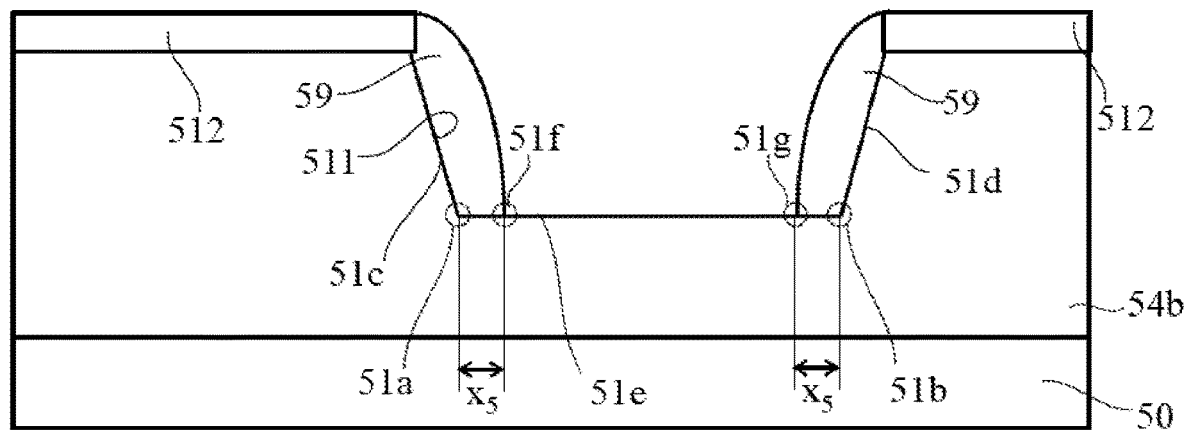
Figure 10C:
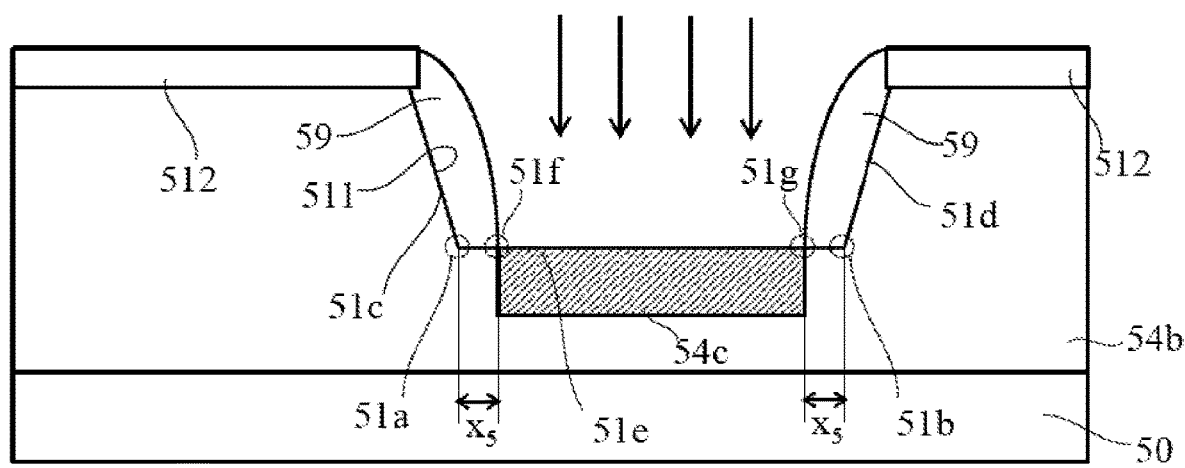

Next, referring to FIG. 10A to FIG. 10C, a method of manufacturing the semiconductor device 5 according to the fifth embodiment is described mainly in terms of characteristic steps.

First, as illustrated in FIG. 10A, the n-type first drain drift-region 54b is formed from the surface of the p-type semiconductor substrate 50 by ion-implanting and thermally diffusing n-type impurities. Next, a mask insulating film 512 for forming a trench in the semiconductor substrate 50 is formed on the semiconductor substrate 50. As the mask insulating film 512, a film that can withstand trench etching to be subsequently performed is adopted.

Next, the mask insulating film 512 in the region in which the trench is formed later is etched to form an opening portion, and then the semiconductor substrate 50 is processed by an anisotropic dry etching method through use of the mask insulating film 512 as a mask to form the trench 511 below the opening portion of the mask insulating film 512. The anisotropic dry etching method is a technology for performing etching substantially in the vertical direction along the opening portion of the mask insulating film 512, and an RIE method is known, for example. Moreover, in order to reduce the N-type impurity concentration in the first drain drift-region 54b near the first corner portion 51a, the second corner portion 51b, the first trench side surface 51c, and the second trench side surface 51d from the state of FIG. 10A, p-type impurities may be ion-implanted at an inclination angle of 15° or more from the vertical direction as required (not shown).

Next, as illustrated in FIG. 10B, a silicon oxide film or other insulating film is deposited in the trench 511 and on the semiconductor substrate 50 to a thickness with which the trench 511 is not completely filled. Then, the insulating film is etched back under anisotropic dry etching conditions to form the sidewall insulating films 59 in contact with the first trench side surface 51c and the second trench side surface 51d. In order to protect the trench bottom surface 51e against damage by the etching back in forming the sidewall insulating films 59, an insulating film may be formed on the trench bottom surface 51e after the trench 511 is formed, and then the sidewall insulating films 59 may be formed.

A width of the sidewall insulating film 59 on the trench bottom surface 51e is the distance $x_5$. Thus, the first position 51f which is away from the first corner portion 51a by the distance $x_5$ and the second position 51g which is away from the second corner portion 51b by the distance $x_5$ are determined. Moreover, the distance $x_5$ corresponds to each of distances from end portions of the second drain drift-region 54c which is formed later to the first corner portion 51a and the second corner portion 51b. The distance $x_5$ is suitably adjustable by the thickness of the insulating film for forming the sidewall insulating film 59.

Next, as illustrated in FIG. 10C, n-type impurities are ion-implanted to the trench bottom surface 51e in the vertical direction illustrated by the solid-line arrows through use of the mask insulating film 512 and the sidewall insulating films 59 as masks, to thereby form the second drain drift-region 54c between the first position 51f and the second position 51g.

Thereafter, a silicon oxide film or other insulating film is deposited and planarized by the CMP method or other method to form the STI insulating film 51 inside the sidewall insulating films 59 in the trench 511. Next, a resist is applied on the surface of the semiconductor substrate 50 as in FIG. 2B, and a resist opening portion is formed by the photolithography technology in a region in which the third drain drift-region is formed later, including the second corner portion 51b and the second position 51g. Then, n-type impurities are ion-implanted in the resist opening portion (not shown). At this time, high ion implantation energy for forming the third drain drift-region 54d below the trench bottom surface 51e to a depth that does not exceed that of the first drain drift-region 54b is selected.

Then, the n-type impurities of the impurity concentration that is higher than the second drain drift-region 54c are implanted to form the third drain drift-region 54d. Then, after formation of the gate insulating film 52, formation of the gate electrode 53, formation of the body region 56, and formation of the high-concentration drain region 54a and the source region 55 and the like, the semiconductor device 5 illustrated in FIG. 9 is completed.

In the method of manufacturing the semiconductor device according to the fifth embodiment, the sidewall insulating films 59 to serve as the masks for implanting the N-type impurities are formed on the first trench side surface 51c and the second trench side surface 51d without using the photolithography technology, and hence the second drain drift-region 54c can be formed in self-alignment with the shape of the trench 511. The variation in distance $x_5$ in FIG. 9 can therefore be reduced, and the variation in effect of suppressing the hot-carrier degradation can also be reduced.

Moreover, as in the fourth embodiment, the implantation of the n-type impurities for forming the second drain drift-region 54c is performed on the trench bottom surface 51e before the STI insulating film 51 is formed. Expansion of an implantation range caused by performing ion implantation with low energy can therefore be reduced, and a variation in implantation depth based on a variation in thickness of the STI insulating film 51 can be reduced. Stable reduction in drain resistance can thus be achieved.

The configurations and the manufacturing methods described in the embodiments of the present invention are not limited to those of the embodiments and may be combined as appropriate without departing from the spirit of the present invention.

Figure 11:
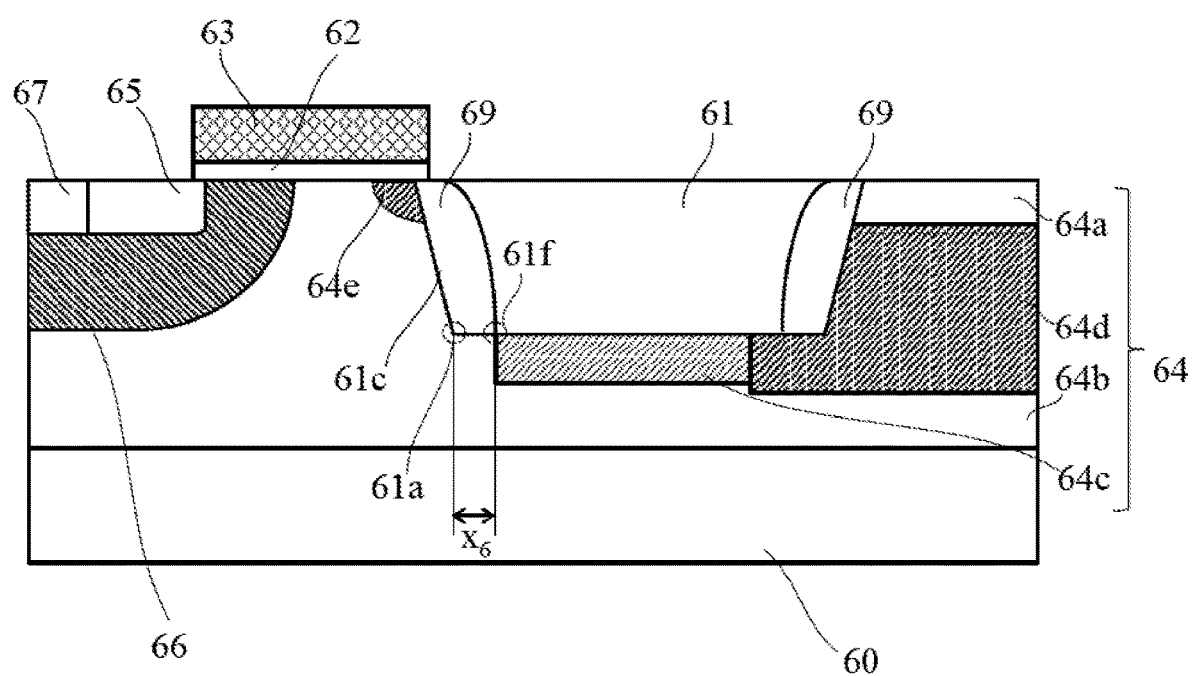
FIG. 11 is a cross-sectional view of a semiconductor device obtained by combining a part of the third embodiment and a part of the fifth embodiment.

For example, as illustrated in FIG. 11, in a semiconductor device 6 which is formed on a p-type semiconductor substrate 60 and includes an n-type drain region 64 and an n-type source region 65, a p-type body region 66, a p-type body contact region 67, a gate insulating film 62, and a gate electrode 63, the characteristic configurations of the third embodiment and the fifth embodiment can be combined.

In this case, a surface drain drift-region 64e which has been described in the third embodiment is formed in contact with the outside of a first trench side surface 61c having a sidewall insulating film 69 formed thereon. Moreover, a second drain drift-region 64c and a third drain drift-region 64d which have been described in the fifth embodiment are provided below an STI insulating film 61 and a high-concentration drain region 64a, respectively.

With this configuration, the drain resistance is reduced by the second drain drift-region 64c, the third drain drift-region 64d, and the surface drain drift-region 64e, each of which has an impurity concentration that is higher than that of a first drain drift-region 64b. Moreover, the second drain drift-region 64c is formed to extend from a first position 61f which is away from a first corner portion 61a by a distance $x_6$ to the high-concentration drain region 64a side, to thereby suppress the hot-carrier degradation and the variation thereof. As a result, the high breakdown voltage and the reduced on-resistance as well as increased long-term reliability can be achieved in the semiconductor device.

The present invention is not limited to the above-mentioned embodiments, and it is to be understood that various modifications can be made thereto without departing from the spirit of the present invention.

Figure 12:
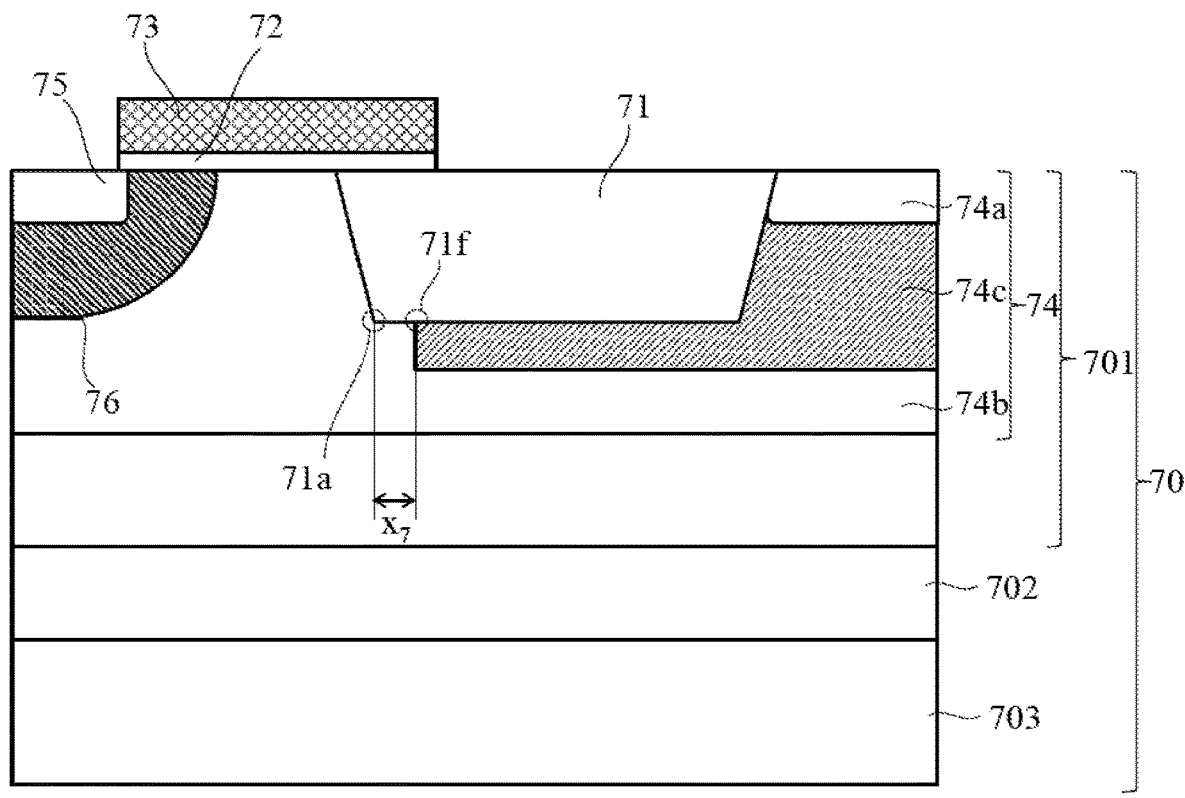
FIG. 12 is a cross-sectional view of a semiconductor device obtained by applying the first embodiment to an SOI substrate.

For example, as illustrated in FIG. 12, in a silicon-on-insulator (SOI) substrate 70 including a p-type silicon layer 701, an insulating layer 702, and a p-type support substrate 703, the semiconductor device described in the first embodiment may be mounted on the silicon layer 701. In other words, there is provided a semiconductor device 7 which is formed on the p-type silicon layer 701 and includes a drain region 74 including an n-type high-concentration drain region 74a, an n-type first drain drift-region 74b, and an n-type second drain drift-region 74c, a source region 75, a p-type body region 76 formed between the drain region 74 and the source region 75, a gate insulating film 72, and a gate electrode 73.

With the above-mentioned configuration, when the drain voltage is applied, the depletion layer on the p-type silicon layer 701 side can be extended to the insulating layer 702, and the depletion layer can be further extended to the support substrate 703 side through the insulating layer 702 below the first drain drift-region 74b. Then, an electric field in the n-type drain region 74 below an STI insulating film 71 can be reduced with the RESURF effect, and at the same time, the electric field is reduced also in a region spreading across the silicon layer 701, the insulating layer 702, and the support substrate 703, to thereby obtain the breakdown voltage of 100 V or more. Meanwhile, the second drain drift-region 74c is formed from a first position 71f which is away from the first corner portion 71a by a distance $x_7$ to extend to the high-concentration drain region 74a side, to thereby suppress the hot-carrier degradation and reduce the drain resistance.

In other words, in the semiconductor device 7, the high drain breakdown voltage of 100 V or more, and the reduction in on-resistance based on the reduction in drain resistance with the configuration of the second drain drift-region 74c, as well as increased long-term reliability through suppression of the hot-carrier degradation, can be achieved.

What is claimed is:

1. A semiconductor device, comprising:
    a semiconductor substrate;
    a drain region of a first conductivity type formed on the semiconductor substrate;
    a source region of the first conductivity type formed on the semiconductor substrate;
    a body region of a second conductivity type formed between the drain region and the source region;
    a gate insulating film formed on the body region;
    a gate electrode formed on the gate insulating film;
    a trench formed in the drain region; and
    a thick insulating film formed in the trench, and having a thickness larger than a thickness of the gate insulating film,
    the trench having a first trench side surface opposed to the body region, a second trench side surface which is opposed to the first trench side surface and the body region and is formed farther away from the body region than the first trench side surface, a trench bottom surface, and a first corner portion formed at an intersecting portion between the trench bottom surface and the first trench side surface as seen in cross-sectional view and a second corner portion formed at an intersecting portion between the trench bottom surface and the second trench side surface as seen in cross-sectional view,
    the drain region comprising:
        a first drain drift-region formed in contact with the body region, the first trench side surface, and the trench bottom surface from the first corner portion to a first position;
        a second drain drift-region formed in contact with the trench bottom surface to extend from the first position in a direction of the second corner portion, and having an impurity concentration that is higher than an impurity concentration of the first drain drift-region; and
        a high-concentration drain region formed away from the body region, the first trench side surface, and the trench bottom surface, and having an impurity concentration higher than the impurity concentration of the second drain drift-region.

2. The semiconductor device according to claim 1, further comprising a third drain drift-region in a region that is in contact with the second drain drift-region and includes the second corner portion and the high-concentration drain region as seen in plan view, the third drain drift-region having an impurity concentration that is higher than the impurity concentration of the second drain drift-region.

3. The semiconductor device according to claim 2, wherein the trench includes second sidewall insulating films formed in contact with the first trench side surface and the second trench side surface, and the thick insulating film formed in contact with the second sidewall insulating films, and wherein one of the second sidewall insulating films formed in contact with the first trench side surface is formed from the first corner portion to the first position on the trench bottom surface.

4. The semiconductor device according to claim 2, further comprising a surface drain drift-region in a region that is located between the body region and the first trench side surface, that is in contact with the first trench side surface, and that is located from under the gate insulating film to a depth that is shallower than a depth of the first corner portion, the surface drain drift-region having an impurity concentration that is higher than the impurity concentration of the first drain drift-region.

5. The semiconductor device according to claim 2, wherein the semiconductor substrate is an SOI substrate.

6. The semiconductor device according to claim 1, further comprising a surface drain drift-region in a region that is located between the body region and the first trench side surface, that is in contact with the first trench side surface, and that is located from under the gate insulating film to a depth that is shallower than a depth of the first corner portion, the surface drain drift-region having an impurity concentration that is higher than the impurity concentration of the first drain drift-region.

7. The semiconductor device according to claim 6, wherein the semiconductor substrate is an SOI substrate.

* * * * *